(12) United States Patent
Shin et al.

(10) Patent No.: US 10,529,393 B2
(45) Date of Patent: Jan. 7, 2020

(54) SEMICONDUCTOR DEVICE AND METHOD OF OPERATING AND CONTROLLING A SEMICONDUCTOR DEVICE

(71) Applicant: Samsung Electronics Co., Ltd., Suwon-si (KR)

(72) Inventors: Seungjun Shin, Incheon (KR); Tae Young Oh, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 15/649,060

(22) Filed: Jul. 13, 2017

(65) Prior Publication Data

US 2018/0053539 A1 Feb. 22, 2018

(30) Foreign Application Priority Data

Aug. 22, 2016 (KR) .................. 10-2016-0105961

(51) Int. Cl.
| | |
|---|---|
| *G11C 7/22* | (2006.01) |
| *G11C 7/06* | (2006.01) |
| *G11C 7/10* | (2006.01) |
| *G11C 7/12* | (2006.01) |
| *G11C 7/18* | (2006.01) |

(Continued)

(52) U.S. Cl.
CPC ............. *G11C 7/22* (2013.01); *G11C 7/06* (2013.01); *G11C 7/1051* (2013.01); *G11C 7/1057* (2013.01); *G11C 7/1084* (2013.01); *G11C 7/12* (2013.01); *G11C 7/18* (2013.01); *G11C 8/08* (2013.01); *G11C 8/10* (2013.01); *G11C 8/14* (2013.01); *G11C 29/00* (2013.01); *G11C 29/025* (2013.01); *G11C 29/028* (2013.01); *G11C 7/04* (2013.01); *G11C 7/20* (2013.01)

(58) Field of Classification Search
CPC ...................................... G11C 7/06; G11C 7/22
USPC ........................................................ 365/63
See application file for complete search history.

(56) References Cited

U.S. PATENT DOCUMENTS

| | | | |
|---|---|---|---|
| 8,416,634 B2* | 4/2013 | Kim ...................... | G11C 7/1051 365/189.07 |
| 8,441,283 B2* | 5/2013 | Kim ............... | H03K 19/018557 326/30 |

(Continued)

FOREIGN PATENT DOCUMENTS

KR    10-2015-0050021 A    5/2015

*Primary Examiner* — Huan Hoang
*Assistant Examiner* — Muna A Techane
(74) *Attorney, Agent, or Firm* — Muir Patent Law, PLLC

(57) ABSTRACT

An exemplary embodiment includes a method of controlling a semiconductor device. The semiconductor device includes a memory cell array including a plurality of memory cells connected between a plurality of word lines and a plurality of bit lines, a row decoder for receiving a row address and selecting a word line corresponding to the row address, a column decoder for receiving a column address and selecting a bit line corresponding to the column address, a sense amplifier for reading data stored in a memory cell connected to the selected word line and the selected bit line, and a data output driver. The method includes setting a calibration code for a driver control code, to control an initial current strength of the data output driver, and changing the calibration code to change the driver control code during a read or write operation for the memory cell array.

11 Claims, 19 Drawing Sheets

(51) Int. Cl.

| | |
|---|---|
| *G11C 8/08* | (2006.01) |
| *G11C 8/10* | (2006.01) |
| *G11C 8/14* | (2006.01) |
| *G11C 29/00* | (2006.01) |
| *G11C 29/02* | (2006.01) |
| G11C 7/20 | (2006.01) |
| G11C 7/04 | (2006.01) |

(56) References Cited

U.S. PATENT DOCUMENTS

| | | | |
|---|---|---|---|
| 2006/0106975 A1 | 5/2006 | Bellows et al. | |
| 2007/0148796 A1 | 6/2007 | Nakamura et al. | |
| 2008/0001623 A1 | 1/2008 | Kim | |
| 2009/0128185 A1 | 5/2009 | Park | |
| 2010/0156455 A1 | 6/2010 | Yang et al. | |
| 2011/0043246 A1 | 2/2011 | Millar | |
| 2011/0074462 A1 | 3/2011 | Chung | |
| 2011/0133774 A1 | 6/2011 | Kim et al. | |
| 2011/0242916 A1* | 10/2011 | Seol | G11C 5/063 365/198 |
| 2012/0099383 A1* | 4/2012 | Kim | G11C 7/1057 365/189.02 |
| 2013/0007562 A1 | 1/2013 | Fai et al. | |
| 2013/0223179 A1* | 8/2013 | Na | H03L 7/18 365/233.1 |
| 2013/0278286 A1 | 10/2013 | Matano | |
| 2015/0348603 A1* | 12/2015 | Lee | H03K 19/0005 365/189.07 |
| 2017/0366183 A1* | 12/2017 | Jung | G11C 11/4074 |

* cited by examiner

FIG. 13

| Step | Current Calibration Code | Previous Calibration Code | 1st Calibration Code | 2nd Calibration Code |
|---|---|---|---|---|
| 1 | 101000 | - | 100101 | 000111 |
| 2 | 101001 | 101000 | 100101 | 001111 |
| 3 | 101010 | 101001 | 100101 | 011111 |

FIG. 16

| Temperature Range | 2nd Calibration Code |
|---|---|
| 0 | 000000 |
| 1 | 000001 |
| 2 | 000011 |
| 3 | 000111 |
| 4 | 001111 |
| 5 | 011111 |
| 6 | 111111 |

FIG. 19

| Step | Current Calibration Code | 1st Calibration Code | Temperature Range | 2nd Calibration Code |
|---|---|---|---|---|
| 1 | 101000 | 101000 | 0 | 000000 |
| 2 | - | 101000 | 1 | 000001 |

SEMICONDUCTOR DEVICE AND METHOD OF OPERATING AND CONTROLLING A SEMICONDUCTOR DEVICE

CROSS-REFERENCE TO RELATED APPLICATION

This application claims priority to and the benefit of Korean Patent Application No. 10-2016-0105961, filed in the Korean Intellectual Property Office on Aug. 22, 2016, the entire contents of which are incorporated herein by reference.

BACKGROUND

(a) Technical Field

Exemplary embodiments relate to a semiconductor memory device and a semiconductor device, and methods of controlling the semiconductor memory device and semiconductor device.

(b) Description of the Related Art

A memory system includes a memory controller and a semiconductor memory device connected to a transmission line. A data signal transmitted along the transmission line of the memory system can be reflected on a terminal of the transmission line. The reflected data signal becomes noise to influence an original data signal and deteriorate the quality of the data signal.

A device that matches impedance is connected to the terminal of the transmission line in order to prevent the reflection of the data signal. The impedance at the terminal of the transmission line matches the impedance of the transmission line between the memory controller and the semiconductor memory device to reduce the reflection of the data signal and prevent the quality of the data signal from being deteriorated.

An impedance value fluctuates according to a change in manufacturing process, fluctuation in power voltage, and a change in operating temperature. When the impedance matching depending on the impedance value which fluctuates is not appropriately achieved, it may be difficult to rapidly transmit the data signal and data may be distorted.

In recent years, semiconductor memory devices use ZQ calibration logic in order to secure high signal quality and stability. The impedance may be adjusted according to a calibration code generated by the ZQ calibration logic.

The above information disclosed in this Background section is only for enhancement of understanding of the background and therefore it may contain information that does not form prior art.

SUMMARY

An exemplary embodiment provides a semiconductor memory device and a semiconductor device in which impedance accurately matches impedance of a transmission line.

In addition, an exemplary embodiment provides a semiconductor memory device and a semiconductor device which can automatically adjust a value of impedance.

Moreover, an exemplary embodiment provides a semiconductor memory device and a semiconductor device which secure a data input/output period.

Methods of controlling these devices are also described.

An exemplary embodiment provides a method of controlling a semiconductor device. The semiconductor device includes a memory cell array including a plurality of memory cells connected between a plurality of word lines and a plurality of bit lines, a row decoder for receiving a row address and selecting a word line corresponding to the row address, a column decoder for receiving a column address and selecting a bit line corresponding to the column address, a sense amplifier for reading data stored in a memory cell connected to the selected word line and the selected bit line, and a data output driver including a first driver including a plurality of first transistors having different sizes from each other and a second driver including a plurality of second transistors having the same size as each other, the first driver and the second driver outputting the data to an output pad and driven to provide impedance to the output pad. The method includes, at a first time, outputting a first calibration code for the first driver and a second calibration code for the second driver to control the impedance provided to the output pad; and at a second time, changing the second calibration code for the second driver, without changing the first calibration code for the first driver, in order to change the impedance provided to the output pad.

Another exemplary embodiment provides a method of controlling a semiconductor device. The semiconductor device includes a memory cell array including a plurality of memory cells connected between a plurality of word lines and a plurality of bit lines, a row decoder for receiving a row address and selecting a word line corresponding to the row address, a column decoder for receiving a column address and selecting a bit line corresponding to the column address, a sense amplifier for reading data stored in a memory cell connected to the selected word line and the selected bit line, and a data output driver. The method includes setting a calibration code for a driver control code, to control an initial current strength of the data output driver, and changing the calibration code to change the driver control code during a read or write operation for the memory cell array.

Yet another exemplary embodiment provides a semiconductor memory device including a memory cell array including a plurality of memory cells connected between a plurality of word lines and a plurality of bit lines, a row decoder for receiving a row address and selecting a word line corresponding to the row address, a column decoder for receiving a column address and selecting a bit line corresponding to the column address, a sense amplifier for reading data stored in a memory cell connected to the selected word line and the selected bit line, and a data output driver. The data output driver includes a first driver including a plurality of first transistors having different sizes from each other and configured to receive a main driver control code, and a second driver including a plurality of second transistors having the same size as each other and configured to receive a fine tuned driver control code.

According to at least one of exemplary embodiments of the present invention, data can be input/output while an impedance value is adjusted.

The impedance value can be automatically adjusted.

BRIEF DESCRIPTION OF THE DRAWINGS

FIG. 13 is a table for describing an example of an impedance calibration method according to an exemplary embodiment.

FIG. 16 is a diagram illustrating a look-up table of FIG. 15, according to some example embodiments.

FIG. 19 is a table for describing an example of an impedance calibration method according to another exemplary embodiment.

DETAILED DESCRIPTION

In the following description, it is assumed that a dynamic random access memory (DRAM) is used as a semiconductor memory device. However, the technical spirit of the present invention can be applied to another semiconductor memory device by those skilled in the art. As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

First, a semiconductor memory device and a semiconductor device according to an exemplary embodiment will be described with reference to FIGS. 1 to 13.

Though the different figures show variations of exemplary embodiments, and may be referred to using language such as "in one embodiment," these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Figure 1:
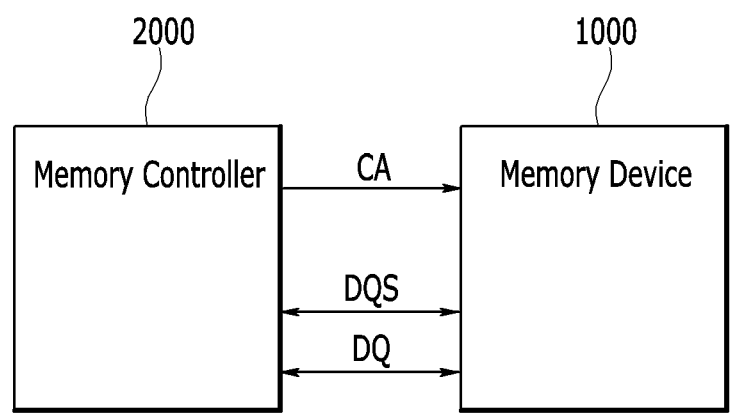
FIG. 1 is a diagram schematically illustrating a memory system according to an exemplary embodiment.

FIG. 1 is a diagram schematically illustrating a memory system according to an exemplary embodiment. The memory system includes a semiconductor memory device 1000 and a memory controller 2000.

The memory device 1000 may be, for example, a semiconductor device such as a chip or package including one or more memory arrays, or may be a memory module including a plurality of chips or packages including one or more memory arrays. The memory device 1000 may operate by receiving a command/address (CA) signal from the memory controller 2000 and transmitting/receiving a data signal DQ and a data strobe signal DQS to/from the memory controller 2000.

The memory controller 2000 may control an overall operation of the memory device 1000, for example, a read, write, or refresh operation and in some embodiments, may be implemented as a part of a system on chip (SoC). However, including the memory controller 2000 as part of a SoC is only one example, and the invention is not limited to this example.

Figure 2:
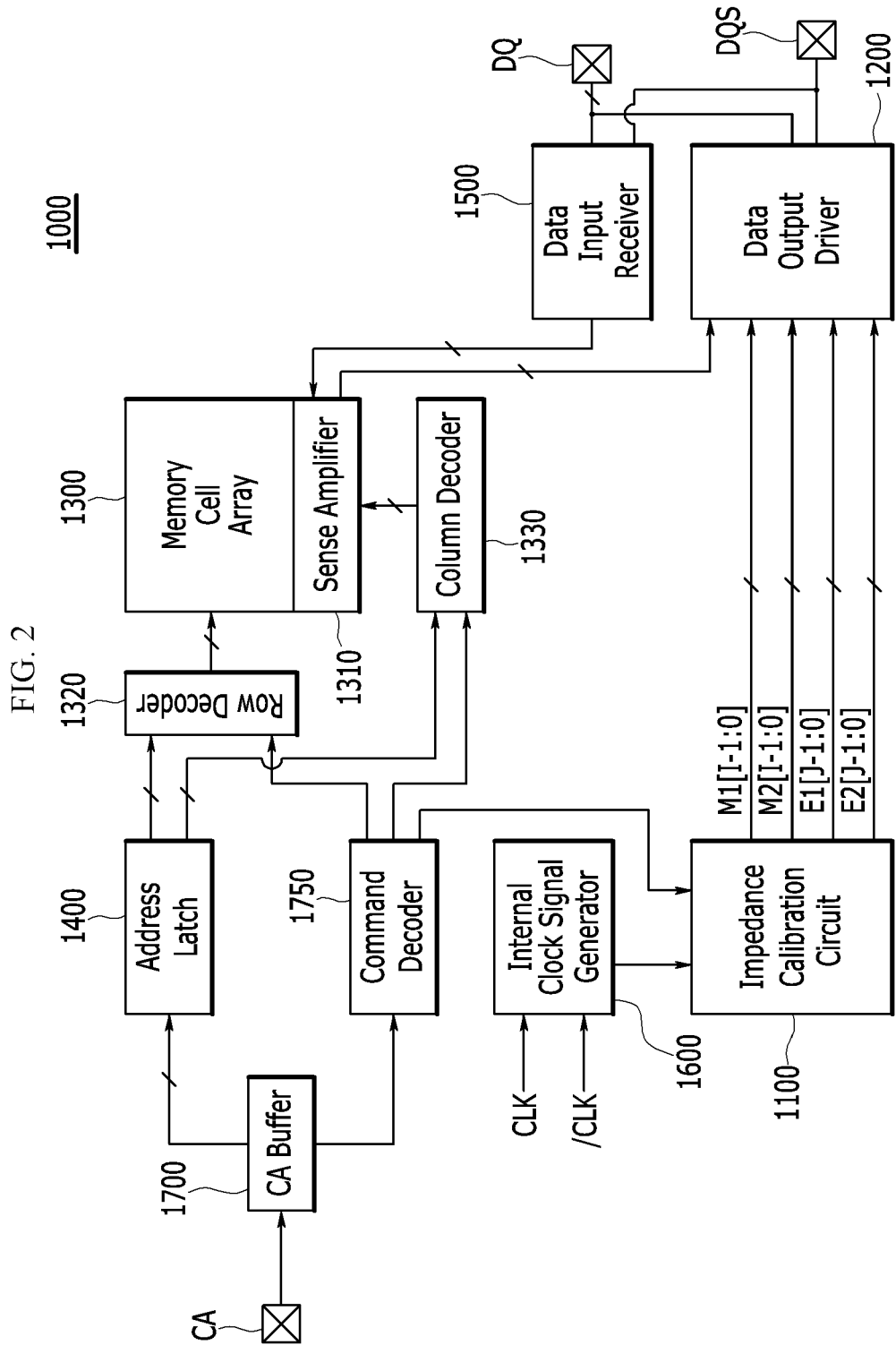
FIG. 2 is a block diagram of a semiconductor memory device illustrated in FIG. 1, according to some example embodiments.

FIG. 2 is a block diagram of a semiconductor memory device illustrated in FIG. 1, according to some example embodiments. As illustrated in FIG. 2, the semiconductor memory device 1000 may include an impedance calibration circuit 1100, a data output driver 1200, a memory cell array 1300, a sense amplifier 1310, a row decoder 1320, a column decoder 1330, an address latch 1400, a data input receiver 1500, an internal clock signal generator 1800, a CA buffer 1700, and a command decoder 1750.

The impedance calibration circuit 1100 may perform a calibration operation for impedance matching of impedance and external resistance. The impedance calibration circuit 1100 may generate a first pull-up ZQ code M1[I-1:0], a first pull-down ZQ code M2[I-1:0], a second pull-up ZQ code E1[J-1:0], and a second pull-down ZQ code E2[J-1:0]. Together these ZQ codes are referred to herein as a refined calibration code, with each portion (e.g., M1, M2, E1, or E2) being part of the refined calibration code. The impedance may match the external resistance by the generated refined calibration code, such as the first pull-up ZQ code M1[I-1:0], first pull-down ZQ code M2[I-1:0], second pull-up ZQ code E1[J-1:0], and second pull-down ZQ code E2[J-1:0].

The refined calibration code may also be described more generally as a calibration code.

The memory cell array 1300 includes memory cells in which word lines and bit lines are connected to the word lines and the bit lines, respectively. Memory cells may store data of at least 1 bit.

The row decoder 1320 may perform an operation of selecting any one of the word lines based on a row address of the memory cell output from the address latch 1400 and an operation of driving the selected word line at required operating voltage. In addition, the column decoder 1330 may control connection between each of the bit lines and the sense amplifier 1310 based on a column address of the memory cell output from the address latch 1400.

The sense amplifier 1310 may generate a current signal corresponding to write-in data based on the write-in data received from the data input receiver 1500 and supply the current signal to at least one bit line connected by the column decoder 1330. Further, the sense amplifier 1310 sense-amplifies a signal output from at least one bit line connected by the column decoder 1330 to generate read data corresponding to the sense-amplified signal and transmit the read data to the data output driver 1200.

The data output driver 1200 may output data stored in the memory cell array 1300 to the outside of the semiconductor memory device 1000 through a DQ pad.

The data outside the semiconductor memory device 1000 may be provided to the data input receiver 1500 through the DQ pad. The data strobe signal may be provided to the data input receiver 1500 through a DQS pad. The data provided to the data input receiver 1500 is latched according to the data strobe signal to be stored in the memory cell array 1300 through the sense amplifier 1310.

The internal clock signal generator 1800 may generate an internal clock signal based on an external clock signal CLK or /CLK.

The CA buffer 1700 is synchronized with the internal clock signal to latch the input command/address signal CA. The latched command and address may be provided to the command decoder 1750 and the address latch 1400, respectively.

The command decoder 1750 receives various commands through the CA buffer 1700. The command decoder 1750 provides the commands to components including the row decoder 1320, the column decoder 1330, and the like.

Hereinafter, the impedance calibration circuit 1100 and the data output driver 1200 of the semiconductor memory device configured as above will be described in detail with reference to FIGS. 3 and 7.

Figure 3:
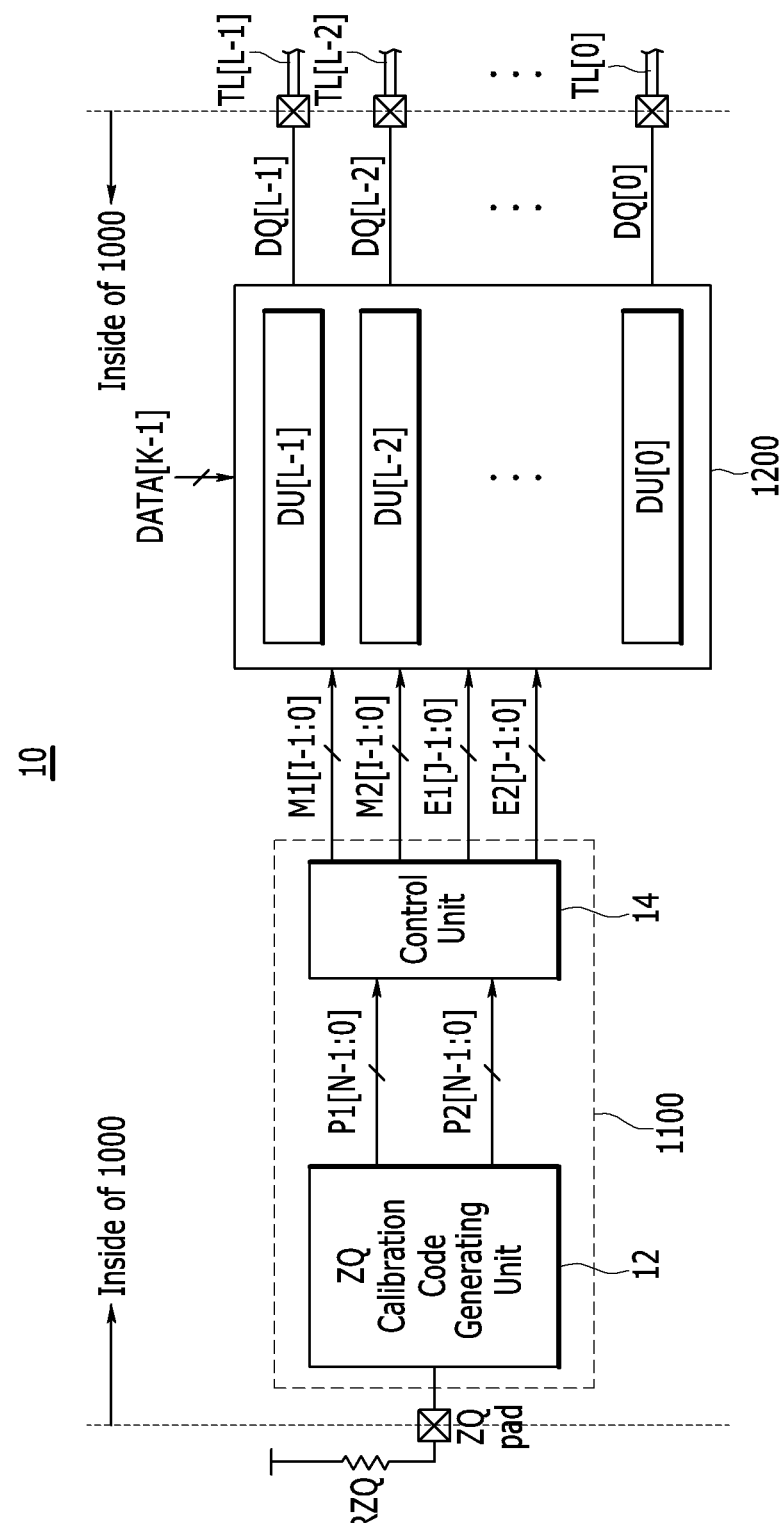
FIG. 3 is a block diagram of a data output circuit of the semiconductor memory device illustrated in FIG. 2, according to some example embodiments.

First, FIG. 3 is a block diagram of a data output circuit of the semiconductor memory device 100 illustrated in FIG. 2. The data output circuit 10 may output read data DATA[N-1], for example, data signals DQ[L-1] to DQ[0] corresponding to the read data to a plurality of DQ pads by receiving the read data.

The data output circuit 10 includes a ZQ calibration code generating unit 12 (hereinafter, also referred to as a code generating unit), a control unit 14, and a data output driver 1200. In this case, the code generating unit 12 and the control unit 14 are components included in the impedance calibration circuit 1100 of FIG. 2.

As is traditional in the field of the disclosed technology, certain features and embodiments are described, and illustrated in the drawings, in terms of functional blocks, units, and/or modules. Those skilled in the art will appreciate that these blocks, units, and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or similar, they may be programmed using software (e.g., microcode) to perform various functions discussed herein and may optionally be driven by firmware and/or software. Alternatively, each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of the embodiments may be physically separated into two or more interacting and discrete blocks, units and/or modules without departing from the scope of the inventive concepts. Further, the blocks, units, and/or modules of the embodiments may be physically combined into more complex blocks, units and/or modules without departing from the scope of the inventive concepts.

The code generating unit 12 is connected to external resistance RZQ through a ZQ pad ZQ to generate a pull-up code P1[N-1:0] and a pull-down code P2[N-1:0]. The code generating unit 12 may generate the pull-up code P1[N-1:0] and the pull-down code P2[N-1:0] by a ZQ calibration operation of comparing a potential of the ZQ pad ZQ and a predetermined reference potential. The pull-up code P1[N-1:0] and pull-down code P2[N-1:0] may be referred to herein together as a calibration code or ZQ calibration code, and in the context of describing other portions of data output circuit 10 may be referred to as an primary calibration code or primary ZQ calibration code.

The control unit 14 generates the first pull-up ZQ code M1[I-1:0], the second pull-up ZQ code E1[J-1:0], the first pull-down ZQ code M2[I-1:0], and the second pull-down ZQ code E2[J-1:0] based on the pull-up code P1[N-1:0] and the pull-down code P2[N-1:0] generated by the code generating unit 12. As such, the control unit 14 generates and outputs a refined calibration code based on an input primary calibration code.

In addition, the first pull-up ZQ code M1[I-1:0] and the first pull-down ZQ code M2[I-1:0] include binary codes and the second pull-up ZQ code E1[J-1:0] and the second pull-down ZQ code E2[J-1:0] include linear codes. For example, a first portion of the refined calibration code, also described as a main calibration code or a main calibration code portion of the refined calibration code (M1[I-1:0] and M2[I-1:0]), may include codes that represent binary bit strings, where each bit of the bit string represents a value different from other bits of the bit string according to a binary scheme. A second portion of the refined calibration code, also described as an extra, auxiliary, or fine tuning calibration code (or code portion) of the refined calibration code (E1[I-1:0] and E2[I-1:0]), may include codes that represent linear bit strings, where each bit of the bit string represents the same value as other bits of the bit string according to a linear scheme. The different portions of the different codes described herein may be referred to using the terms "first" and "second" as a naming convention to differentiate the different parts of the codes, where "first" and "second" may be used to refer to different codes or portions of codes in different descriptions or claim sets.

The first pull-up ZQ code M1[I-1:0] and the first pull-down ZQ code M2[I-1:0] may be formed by I bits and the second pull-up ZQ code E1[J-1:0] and the second pull-down ZQ code E2[J-1:0] may be formed by J bits. I and J may be integers greater than 1, where I may be the same as or different from J.

In this case, an aggregation of the first pull-up ZQ code M1[I-1:0] and the second pull-up ZQ code E1[J-1:0] output by the control unit 14 may be the same as the pull-up code P1[N-1:0] input in the control unit 14. For example, the value represented by the first pull-up ZQ code (e.g., a first main calibration code) and the second pull-up ZQ code (e.g., a first fine tuning calibration code) output by the control unit 14 may represent the same value as the value represented by pull-up code P1[N-1:0] (e.g., by a first primary calibration code) input to the control unit 14. Similarly, an aggregation of the first pull-down ZQ code M2[I-1:0] and the second pull-down ZQ code E2[J-1:0] output by the control unit 14 may be the same as the pull-down code P2[N-1:0] input in the control unit 14. For example, the value represented by the first pull-down ZQ code (e.g., a second main calibration code) and the second pull-down ZQ code (e.g., a second fine tuning calibration code) output by the control unit 14 may represent the same value as the value represented by pull-down code P2[N-1:0] (e.g., by a second primary calibration code) input to the control unit 14.

The data output driver 1200 includes a plurality of data output units DU[0] to DU[L-1]. The plurality of data output units DU[0] to DU[L-1] may output the data DQ[0] to DQ[L-1] to corresponding transmission lines TL[0] to TL[L-1] through the corresponding DQ pads, respectively. For example, a first data output unit DU[0] outputs the read data DQ[0] to a first transmission line TL[0].

In some embodiments, the plurality of data output units DU[0] to DU[L-1] output the data DQ[0] to DQ[L-1] based on the pull-up ZQ codes M1[I-1:0] and E1[J-1:0] and the pull-down ZQ codes M2[I-1:0] and E2[J-1:0] (e.g., based on a refined calibration code).

Alternatively, the plurality of data output units DU[0] to DU[L-1] may operate as on-die termination (ODT) that performs a termination operation to provide the impedance to the transmission lines TL[0] to TL[L-1] when the data is input in the semiconductor memory device 1000.

Next, the data output unit DU[0] of the data output circuit 10 will be described with reference to FIGS. 4 to 7. Since a configuration and an operation of the data output unit DU[0] are the same as or similar to another data output unit included in the data output driver 1200, only the data output unit DU[0] will be described below.

Figure 4:
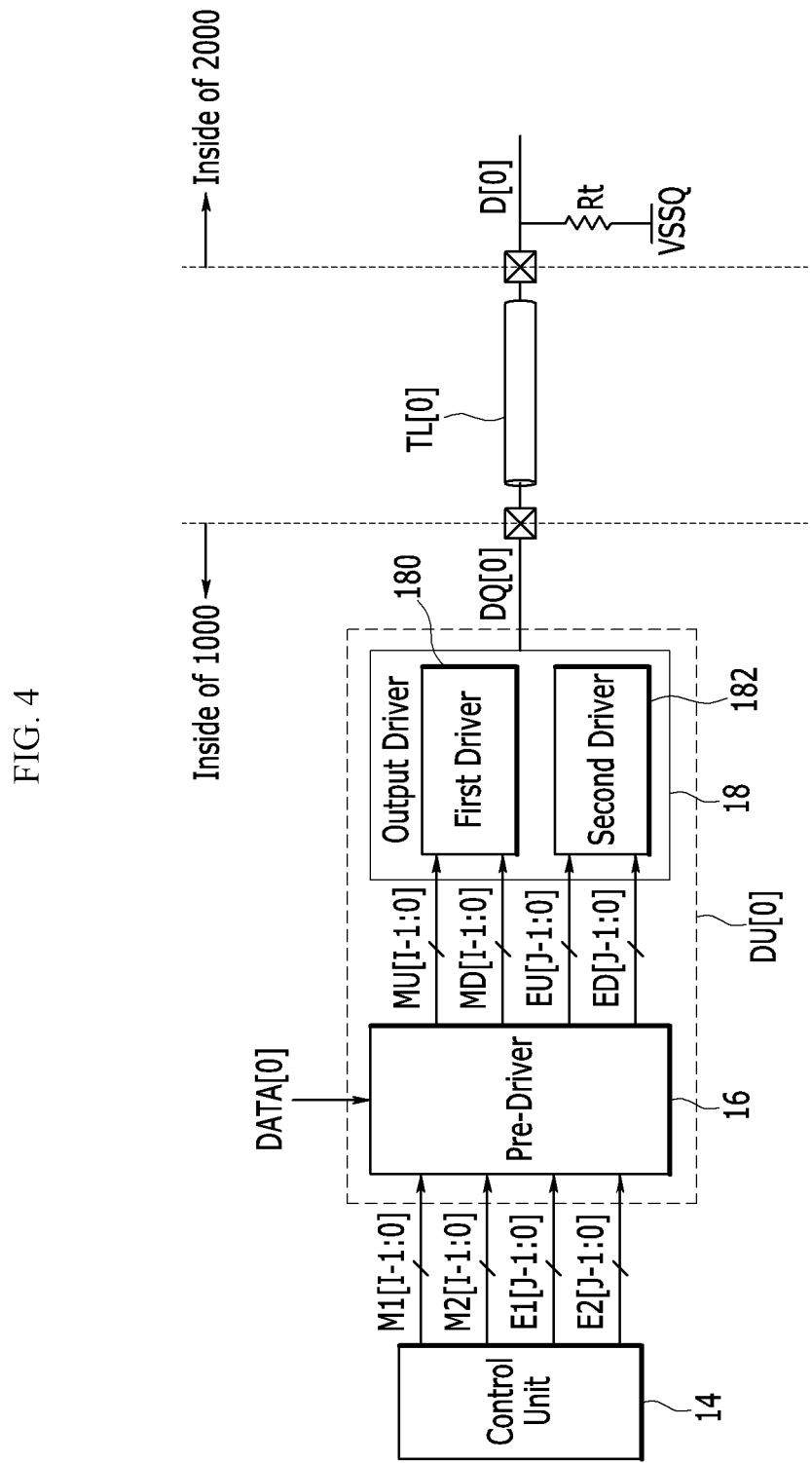
FIG. 4 is a block diagram illustrating a part of the data output circuit according to an exemplary embodiment.

FIG. 4 is a block diagram illustrating a part of the data output circuit according to an exemplary embodiment. As illustrated in FIG. 4, the data output unit DU[0] includes a pre-driver 16 and an output driver 18.

The pre-driver 16 may generate pull-up drive signals MU[I-1:0] and EU[J-1:0] and pull-down drive signals MD[I-1:0] and ED[J-1:0] based on the pull-up ZQ codes M1[I-1:0] and E1[J-1:0], the pull-down ZQ codes M2[I-1:0] and E2[J-1:0], and the read data DATA[0]. For example, the pre-driver 16 may receive data as well as the refined calibration code as input (e.g., main calibration code M1[I-1:0] and M2[I-1:0], and fine tuning calibration code E1[J-1:0] and E2[J-1:0]), and may output driver control codes, described in more detail below. The pre-driver 16 will be described together with reference to FIG. 5.

Figure 5:
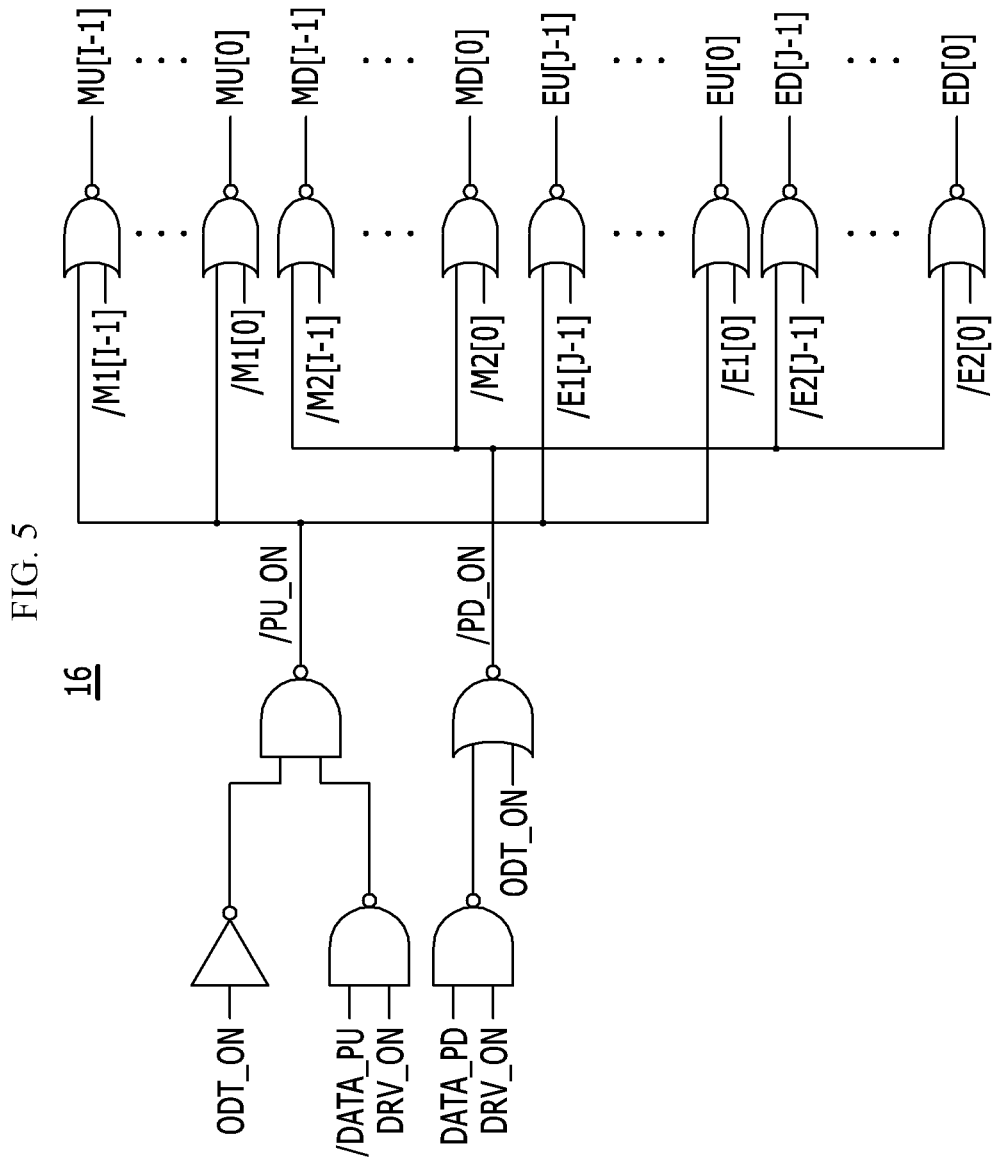
FIG. 5 is a circuit diagram schematically illustrating a pre-driver illustrated in FIG. 4, according to some example embodiments.

FIG. 5 is a circuit diagram schematically illustrating the pre-driver 16 illustrated in FIG. 4. As illustrated in FIG. 5, when the semiconductor memory device 1000 outputs the data, the pre-driver 16 generates the pull-up drive signals MU[I-1:0] and EU[J-1:0] and the pull-down drive signals MD[I-1:0] and ED[J-1:0].

In detail, when the semiconductor memory device 1000 outputs the data, the pre-driver 16 may generate the pull-up drive signals MU[I-1:0] and EU[J-1:0] according to logic levels of a first control signal DRV_ON, a second control signal ODT_ON, the pull-up ZQ codes /M1[I-1:0] and /E1[J-1:0], and data /DATA_PU to be output. Further, when the semiconductor memory device 1000 outputs the data, the pre-driver 16 may generate the pull-down drive signals MD[I-1:0] and ED[J-1:0] according to the logic levels of the first control signal DRV_ON, the second control signal ODT_ON, the pull-down ZQ codes /M2[I-1:0] and /E2[J-1:0], and data /DATA_PD to be output.

As one example, when the semiconductor memory device 1000 outputs high-level data, since the first control signal DRV_ON is at a high level, the second control signal ODT_ON is at a low level, the data /DATA_PU is at the low level, and the data /DATA_PD is at the high level, a pull-up control signal /PU_ON is output at the low level and a pull-down control signal /PD_ON is output at the high level. Since the pull-up control signal /PU_ON is at the low level, the pull-up drive signals MU[I-1:0] and EU[J-1:0] corresponding to the pull-up ZQ codes /M1[I-1:0] and /E1[J-1:0] are output. In addition, the pull-down drive signals MD[I-1:0], ED[J-1:0] are output at the low level by the high-level pull-down control signal /PD_ON. As can be seen, the pre-driver is therefore configured to receive data and receive a calibration code including a main calibration code and a fine tuning calibration code (e.g., M1, M2, E1, and E2), output the main driver control code (e.g., MU and MD) based on the data and the main calibration code, and output the fine tuned driver control code (e.g., EU and ED) based on the data and the fine tuning calibration code. The main driver control code may be a binary code, for example, a code that represents binary information where each bit represents a different value raised to a different power of 2, and the fine tuned driver control code may be a linear code, for example, a code that represents linear information where each bit represents the same value.

As another example, when the semiconductor memory device 1000 outputs low-level data, since the first control signal DRV_ON is at the high level, the second control signal ODT_ON is at the low level, the data /DATA_PU is at the high level, and the data DATA_PD is at the low level, the pull-up control signal /PU_ON is output at the high level and the pull-down control signal /PD_ON is output at the low level. Since the pull-down control signal /PD_ON is at the low level, the pull-down drive signals MD[I-1:0] and ED[J-1:0] corresponding to the pull-down ZQ codes /M2[I-1:0] and /E2[J-1:0] are output. In addition, the pull-up drive signals MU[I-1:0], EU[J-1:0] are output at the low level by the high-level pull-up control signal /PU_ON.

Further, when the data is input in the semiconductor memory device 1000, the pre-driver 16 may generate the pull-up drive signals MU[I-1:0] and EU[J-1:0] according to the logic levels of the first control signal DRV_ON, the second control signal ODT_ON, and the pull-up ZQ codes M1[I-1:0] and E1[J-1:0]. In addition, when the data is input in the semiconductor memory device 1000, the pre-driver 16 may generate the pull-down drive signals MD[I-1:0] and ED[J-1:0] according to the logic levels of the first control signal DRV_ON, the second control signal ODT_ON, and the pull-down ZQ codes /M2[I-1:0] and /E2[J-1:0].

For example, since the first control signal DRV_ON is at the low level and the second control signal ODT_ON is at the high level, the pull-up control signal /PU_ON is output at the high level and the pull-down control signal /PD_ON is output at the low level. Since the pull-down control signal /PD_ON is at the low level, the pull-down drive signals MD[I-1:0] and ED[J-1:0] corresponding to the pull-down ZQ codes /M2[I-1:0] and /E2[J-1:0] are output.

Next, referring back to FIG. 4, the output driver 18 is connected to the transmission line TL[0] through the DQ pad. The output driver 18 provides the impedance to the transmission line TL[0] in response to the input pull-up drive signals MU[I-1:0] and EU[J-1:0] or the pull-down drive signals MD[I-1:0] and ED[J-1:0] (e.g., the main and fine tuned/extra/auxiliary driver control codes).

A value of the impedance may be determined according to the pull-up drive signals MU[I-1:0] and EU[J-1:0] or the pull-down drive signals MD[I-1:0] and ED[J-1:0]. The first pull-up drive signal MU[I-1:0] and the first pull-down drive signal MD[I-1:0] may be input into a first driver 180 and the second pull-up drive signal EU[J-1:0] and the second pull-down drive signal ED[J-1:0] may be input into a second driver 182.

The output driver 18 may output the read data DATA[0] to the outside through the transmission line TL[0] in response to the input pull-up drive signals MU[I-1:0] and EU[J-1:0] or pull-down drive signals MD[I-1:0] and ED[J-1:0].

A data signal D[0] received by the memory controller 2000 may be determined by current generated by the output driver 18 and termination resistance Rt at the memory controller 2000.

Further, impedance when the output driver 18 outputs the read data DATA[0] having the high level and impedance when the output driver 18 outputs the read data DATA[0] having the low level may be different from each other.

In addition, the output driver 18 may include the first driver 180 in which the first pull-up drive signal MU[I-1:0] and the first pull-down drive signal MD[I-1:0] (e.g., first, main driver control codes) are input and the second driver 182 in which the second pull-up drive signal EU[J-1:0] and the second pull-down drive signal ED[J-1:0] (e.g., second, fine tuned driver control codes) are input.

Hereinafter, the output driver 18 including the first driver 180 and the second driver 182 will be described in more detail with reference to FIG. 6.

Figure 6:
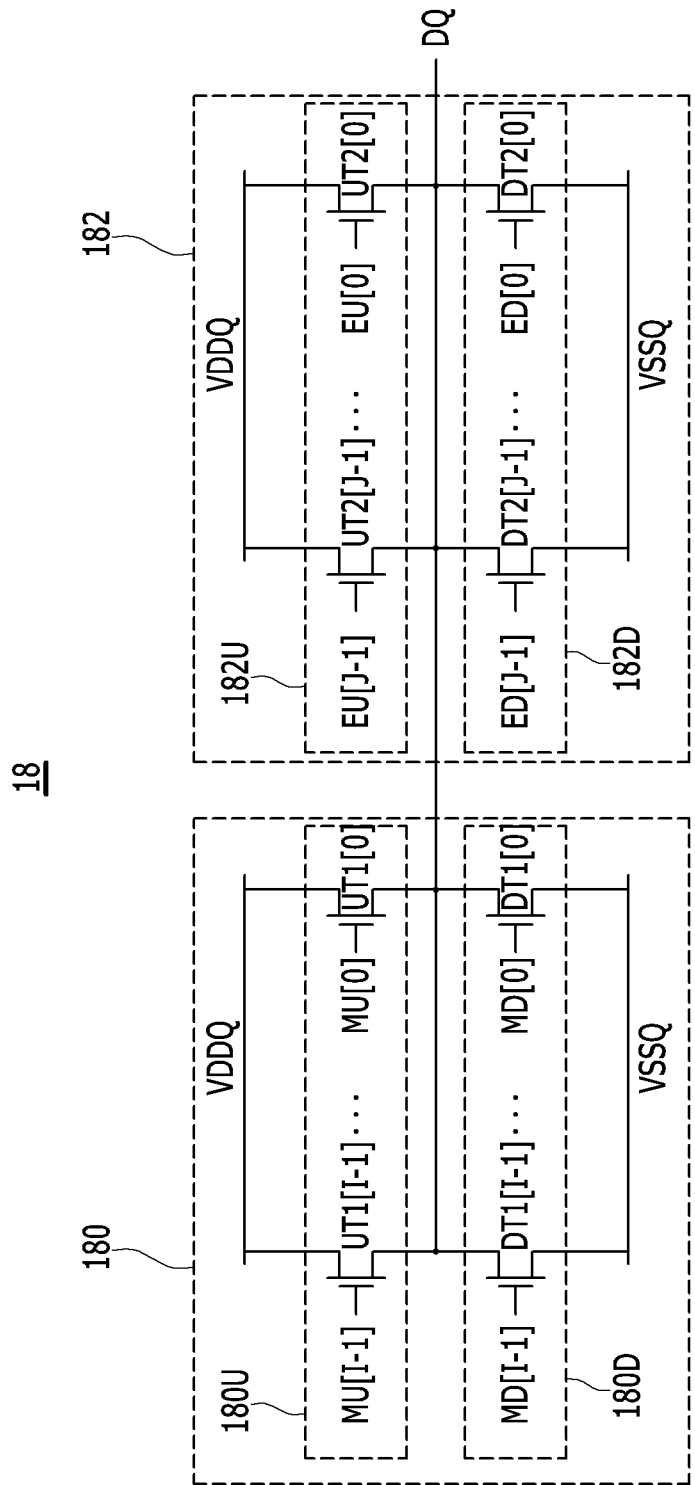
FIG. 6 is a circuit diagram schematically illustrating an output driver illustrated in FIG. 4, according to some example embodiments.

FIG. 6 is a circuit diagram schematically illustrating an output driver illustrated in FIG. 4. As illustrated in FIG. 6, the first driver 180 may include a first pull-up driver 180U and a first pull-down driver 180D and the second driver 182 may include a second pull-up driver 182U and a second pull-down driver 182D.

First, the first pull-up driver 180U and the first pull-down driver 180D of the first driver 180 will be described.

The first pull-up driver 180U may include a plurality of main pull-up transistors UT1[I-1:0] of which one end is connected to first power voltage VDDQ and the other end is connected to a DQ node DQ. In this case, bits of respective first pull-up drive signals MU[I-1:0] may be applied to gates of the plurality of main pull-up transistors UT1[I-1:0]. In detail, respective main pull-up transistors UT1[I-1:0] may be turned on or turned off based on a value of each bit of a first pull-up drive signal MU[I-1:0] having n bits.

A size (e.g., a channel width W/a channel length L) of a transistor increases sequentially from a first main pull-up transistor UT1[0] to an n-th main pull-up transistor UT1[I-1].

In detail, the size (e.g., W/L) of the main pull-up transistor to which a high-order bit of the first pull-up drive signal MU[I-1:0] is applied may be larger than the size (e.g., W/L) of the main pull-up transistor to which a low-order bit of the first pull-up drive signal MU[I-1:0] is applied. For example, the size (e.g., W/L) of a transistor UT1[I-1] to which a most significant bit of the first pull-up drive signal MU[I-1:0] is applied may be largest and the size W/L of a transistor UT1[0] to which a least significant bit of the first pull-up drive signal MU[I-1:0] is applied may be smallest. Different consecutive sizes of adjacent transistors may change by orders of 2, and/or so that resistance values of adjacent transistors change by orders of 2. Therefore, the main pull-up transistor which is turned on under the control of the high-order bit of the first pull-up drive signal MU[I-1:0] may drive more current than the main pull-up transistor which is turned on under the control of the low-order bit of the first pull-up drive signal MU[I-1:0].

In addition, the first pull-down driver 180D may include a plurality of main pull-down transistors DT1[I-1:0] of which one end is connected to second power voltage VSSQ and the other end is connected to the DQ node DQ. In this case, bits of respective first pull-down drive signals MD[I-1:0] may be applied to the gates of the plurality of main pull-down transistors DT1[I-1:0]. In detail, respective main pull-down transistors DT1[I-1:0] may be turned on or turned off based on a value of each bit of the first pull-up drive signal MD[I-1:0] having n bits.

It is assumed that the size (e.g., W/L) of the transistors increase sequentially from the first main pull-down transistor DT1[0] to the n-th main pull-down transistor DT1[I-1] and a resistance value of the transistor increases to double in the reverse order to the size (e.g., W/L) of the transistor. In detail, the size (e.g., W/L) of the main pull-down transistor to which the high-order bit of the first pull-down drive signal MD [I-1:0] is applied may be larger than the size (e.g., W/L) of the main pull-down transistor to which the low-order bit of the first pull-down drive signal MD[I-1:0] is applied. For example, the size (e.g., W/L) of a transistor DT1[I-1] to which the most significant bit of the first pull-down drive signal MD [I-1:0] is applied may be largest and the size (e.g., W/L) of a transistor DT1[0] to which the least significant bit of the first pull-down drive signal MD[I-1:0] is applied may be smallest. Therefore, the main pull-down transistor which is turned on under the control of the high-order bit of the first pull-down drive signal MU[I-1:0] may drive more current than the main pull-down transistor which is turned on under the control of the low-order bit of the first pull-down drive signal MD[I-1:0].

Next, the second pull-up driver 182U and the second pull-down driver 182D of the second driver 182 will be described.

The second pull-up driver 182U may include a plurality of sub pull-up transistors UT2[J-1:0], also described as auxiliary or fine tuning transistors, of which one end is connected to the first power voltage VDDQ and the other end is connected to the DQ node DQ. In this case, bits of respective second pull-up drive signals EU[J-1:0] (e.g., first, fine tuned driver control codes) may be applied to the gates of the plurality of sub pull-up transistors UT2[J-1:0]. In detail, respective sub pull-up transistors UT2[J-1:0] may be turned on or turned off based on the value of each bit of the second pull-up drive signal EU[J-1:0] having m bits.

It is assumed that the sizes (e.g., W/L) of first to m-th sub pull-up transistors UT2[0] to UT2[J-1] are the same as each other, and thus the resistance of each pull-up transistor is the same. In detail, the size (e.g., W/L) of a sub pull-up transistor UT2[J-1] to which the high-order bit of the second pull-up drive signal EU[J-1:0] is applied may be the same as the size (e.g., W/L) of the sub pull-up transistor UT2[0] to which the low-order bit of the second pull-up drive signal EU[J-1:0] is applied. In this case, the sizes (e.g., W/L) of the first to m-th sub pull-up transistors UT2[0] to UT2[J-1] may be the same as the size of the first main pull-up transistor UT1[0]. Therefore, the sub pull-up transistor which is turned on under the control of the high-order bit of the second pull-up drive signal EU[J-1:0] may drive the same current as the sub pull-up transistor which is turned on under the control of the low-order bit of the second pull-up drive signal EU[J-1:0].

In addition, the second pull-down driver 182D may include a plurality of sub pull-down transistors DT2[J-1:0], also described as auxiliary or fine tuning transistors, of which one end is connected to the second power voltage VSSQ and the other end is connected to the DQ node DQ. In this case, bits of respective second pull-down drive signals ED[J-1:0] (e.g., second, fine tuned driver control codes) may be applied to the gates of the plurality of sub pull-down transistors DT2[J-1:0]. In detail, respective sub pull-down transistors DT2[J-1:0] may be turned on or turned off based on the value of each bit of the second pull-down drive signal ED[J-1:0] having m bits.

It is assumed that the sizes (e.g., W/L) of first to m-th sub pull-down transistors DT2[0] to DT2[J-1] are the same as each other, and thus the resistance of each pull-up transistor is the same. In detail, the size (e.g., W/L) of the sub pull-down transistor DT2[J-1] to which the high-order bit of the second pull-down drive signal ED[J-1:0] is applied may be the same as the size (e.g., W/L) of the sub pull-down transistor DT2[0] to which the low-order bit of the second pull-down drive signal ED[J-1:0] is applied. In this case, the sizes (e.g., W/L) of the first to m-th sub pull-down transistors DT2[0] to DT2[J-1] may be the same as the size of the first main pull-down transistor DT1[0]. Therefore, the sub pull-down transistor which is turned on under the control of the high-order bit of the second pull-down drive signal ED[J-1:0] may drive the same current as the sub pull-down transistor which is turned on under the control of the low-order bit of the second pull-up drive signal EU[J-1:0]. In this manner, the different transistors of each auxiliary pull-up and pull-down driver have a linear relationship with each other.

Next, the first driver 180 and the second driver 182 will be described in detail with reference to FIG. 7 together.

Figure 7:
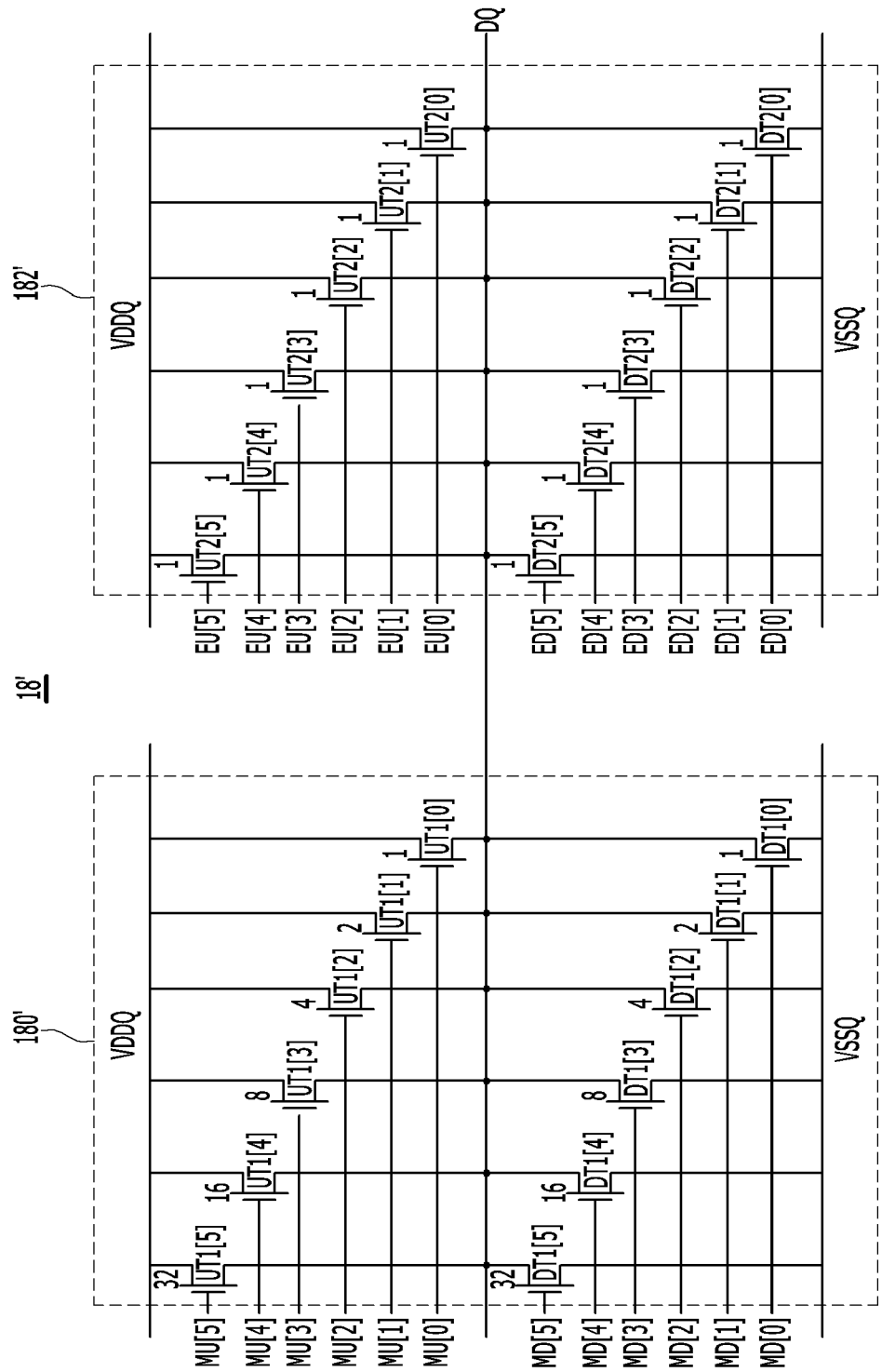
FIG. 7 is a circuit diagram illustrating one aspect of the output driver of FIG. 6, according to some example embodiments.

FIG. 7 is a circuit diagram illustrating one example of the output driver 18 of FIG. 6. A first pull-up drive signal MU[5:0] and a first pull-down drive signal MD[5:0] may be constituted by 6-bit binary codes and a second pull-up drive signal EU[5:0] and a second pull-down drive signal ED[5:0] may be constituted by 6-bit linear codes.

A first driver 180' may include 6 main pull-up transistors UT1[5:0] in which the 6-bit first pull-up drive signal MU[5:0] is input and 6 main pull-down transistors DT1[5:0] in which the 6-bit first pull-down drive signal MD[5:0] is input. Each of the 6 main pull-up transistors UT1[5:0] may be turned on or turned off by a value of each bit of the input first pull-up drive signal MU[5:0]. Each of the 6 main pull-down transistors DT1[5:0] may be turned on or turned off by the value of each bit of the input first pull-down drive signal MD[5:0]. The first pull-up drive signal MU[5:0] and first pull-down drive signal MD[5:0] may together be described as a main driver control code, which can be a binary code as it includes a set of bits that represent a binary signal for the transistors DT1[5:0] and UT1[5:0].

The size (e.g., the channel width W/the channel length L) of the transistors increase sequentially from a first main pull-up transistor UT1[0] to a sixth main pull-up transistor UT1[I5]. The size (e.g., W/L) of the main pull-up transistor may be determined according to a bit position of the first pull-up drive signal MU[5:0] corresponding thereto.

In detail, the size (e.g., W/L) of the main pull-up transistor to which the high-order bit of the first pull-up drive signal MU[5:0] which is the binary code is applied may be larger than the size (e.g., W/L) of the main pull-up transistor to which the low-order bit of the first pull-up drive signal MU[5:0] is applied. For example, the size (e.g., W/L) of the transistor UT1[I-1] to which the most significant bit MSB of the first pull-up drive signal MU[I-1:0] is applied may be largest and the size (e.g., W/L) of the transistor UT1[0] to which the least significant bit LSB of the first pull-up drive signal MU[I-1:0] is applied may be smallest.

In one embodiment, the respective main pull-up transistors MU[5:0] may include different number of reference transistors in order to vary the size (e.g., W/L) of the transistor depending on the bit positions of the corresponding first pull-up drive signals MU[5:0]. In this embodiment, all of the respective main pull-up transistors MU[5:0] are the same as each other in terms of the size (e.g., W/L) of the reference transistor, but different main pull-up transistors have different numbers of reference transistors.

For example, the transistor UT1[5] to which the most significant bit (MSB) of the first pull-up drive signal MU[5:0] is applied may include 32 reference transistors and the transistor UT1[0] to which the least significant bit (LSB) of the first pull-up drive signal MU[5:0] is applied may include 1 reference transistor. The remaining first pull-up transistors may have, from largest to smallest, 16, 8, 4, and 2 reference transistors, respectively, such that each first pull-up transistor is a factor of 2 different from its adjacent first pull-up transistor. The 6 main pull-up transistors UT1[5:0] are described as above, and the description may be similarly applied to the 6 main pull-down transistors DT1[5:0].

Next, a second driver 182' may include 6 sub pull-up transistors UT2[5:0] in which a 6-bit second pull-up drive signal EU[5:0] is input and 6 sub pull-down transistors DT2[5:0] in which a 6-bit second pull-down drive signal ED[5:0] is input. Each of the 6 sub pull-up transistors UT2[5:0] may be turned on or turned off by a value of each bit of the input second pull-up drive signal EU[5:0]. Each of the 6 sub pull-down transistors DT2[5:0] may be turned on or turned off by the value of each bit of the input 6-bit second pull-down drive signal ED[5:0].

The sizes (e.g., W/L) of first to 6-th sub pull-up transistors UT2[0] to UT2[5] are the same as each other. In detail, the size (e.g., W/L) of the sub pull-up transistor to which the high-order bit of the second pull-up drive signal EU[5:0] which is the linear code is applied is the same as the size (e.g., W/L) of the sub pull-up transistor to which the low-order bit of the second pull-up drive signal EU[5:0] is applied.

In this case, the respective sub pull-up transistors UT2[5:0] may include the same number of reference transistors. For example, in one embodiment, all of the respective sub pull-up transistors UT2[5:0] corresponding to the respective bits of the 6-bit second pull-up drive signal EU[5:0] include one reference transistor. This may be the same number of reference transistors as each of the main pull-up and main pull-down transistors having the smallest number of reference transistors (e.g., UT1[0] and DT1[0]). In this manner, a size or a number of reference transistors in each sub-transistor may have a relative size of 1, which may be the same as the size or the number of reference transistors in the smallest main transistor, and the different main transistors other than the smallest main transistor may have a size or numbers of transistors from 2 times the size or number of transistors as the relative size of 1 to 1×2$^{n-1}$ times the size or number of transistors as the relative size of 1. All of the respective sub pull-up transistors UT2[5:0] are the same as each other in terms of the size W/L of the reference transistor. The 6 sub pull-up transistors UT2[5:0] is described as above, and the description may be similarly applied to the 6 sub pull-down transistors DT2[5:0]. The second pull-up drive signal EU[5:0] and second pull-down drive signal ED[5:0] may together be described as a fine tuned driver control code, which can be a linear code as it includes a set of bits that represent a linear signal for the transistors DT2[5:0] and UT2[5:0]. Though an example is given where the sub-transistors, also referred to as fine-tuning transistors, have a size the same as the smallest one of the main transistors, also referred to as coarse-tuning transistors, they may have a size, for example, smaller or larger than the smallest one of the main transistors (e.g., between about ¾ the size 1.25 times the size of the smallest main transistor).

As described in FIGS. 6 and 7, the impedance value which the output driver 18 provides to the transmission line may vary according to the turn-on or turn-off of the respective transistors included in the first pull-up driver 180U and the second pull-up driver 182U of the output driver 18. Further, the impedance value which the output driver 18 provides to the transmission line may vary according to the turn-on or turn-off of the respective transistors included in the first pull-down driver 180D and the second pull-down driver 182D of the output driver 18.

The first full-up driver 180U and the first pull-down driver 180D operate by receiving the binary code type first pull-up drive signal MU[I-1:0] and first full-down drive signal MD[I-1:0], respectively (e.g., a main driver control code). In the case of the binary code, when the low-order bit value is changed, the high-order bit value of the changed bit may be together changed. For example, in the case where the first pull-up drive signal MU[I-1:0] is '101111', the least significant bit value increases by '1', the first pull-up drive signal MU[I-1:0] is changed to '110000'. In addition, as the first pull-up drive signal MU[I-1:0] is changed from '101111' to '110000', operations of residual main pull-up transistors UT1[N-2:0] other than the main pull-up transistor UT1[I-1] corresponding to the most significant bit of the first pull-up driver 180U are changed. Most of the operations of the main pull-up transistors UT1[I-1:0] included in the first pull-up driver 180U are changed (e.g., 5 out of 6), and as a result, the data output by the output driver 18 may be distorted. Therefore, the data output of the output driver 18 stops and thereafter, the first pull-up driver 180U operates by receiving the changed first pull-up drive signal MU[I-1:0].

In this regard, an operation of changing the impedance value of the output driver 18 will be described with reference to a timing diagram of FIG. 8.

Figure 8:
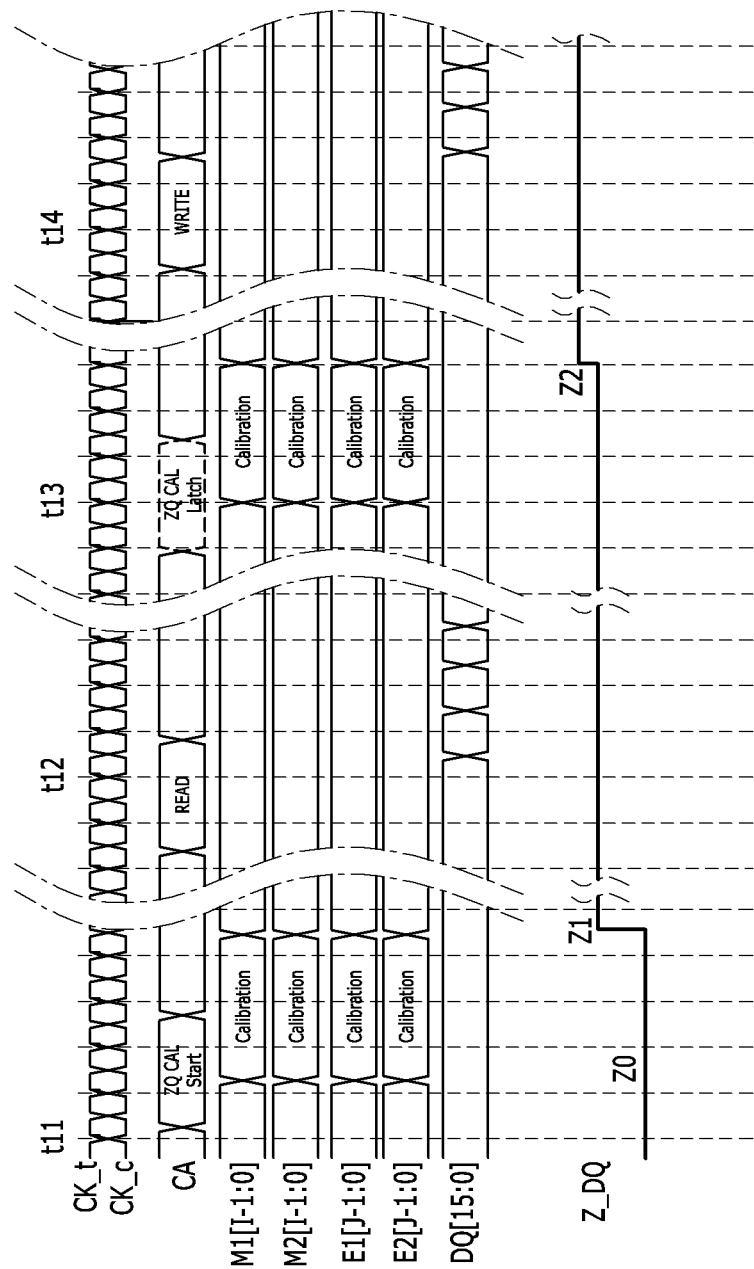
FIGS. 8 and 9 are timing diagrams illustrating an operation of a semiconductor memory device according to an exemplary embodiment.

FIG. 8 is a timing diagram illustrating an operation of the semiconductor memory device 1000 according to the exemplary embodiment. In FIG. 8, the operation is described by assuming the case where the impedance value is changed by using all of the first pull-up driver 180U, the first pull-down driver 180D, the second pull-up driver 182U, and the second pull-down driver 182D.

As illustrated in FIG. 8, the code generating unit 12 may perform the ZQ calibration operation when a ZQ calibration start command ZQ CAL Start is first input after power-up.

For example, the code generating unit 12 may generate the pull-up code P1[N-1:0] and the pull-down code P2[N-1:0] by using external ZQ resistor according to the ZQ calibration start command ZQ CAL Start which is the command/address signal CA at a time of t11.

In addition, the control unit 14 may generate the first pull-up ZQ code M1[I-1:0], the first pull-down ZQ code M2[I-1:0], the second pull-up ZQ code E1[J-1:0], and the second pull-down ZQ code E2[J-1:0] by using the pull-up code P1[N-1:0] and the pull-down code P2[N-1:0] and output the generated codes to the data output driver 1200.

Then, the first pull-up driver 180U, the first pull-down driver 180D, the second pull-up driver 182U, and the second pull-down driver 182D operate by the first pull-up ZQ code M1[I-1:0], the first pull-down ZQ code M2[I-1:0], the second pull-up ZQ code E1[J-1:0], and the second pull-down ZQ code E2[J-1:0] (e.g., a main driver control code and fine-tuned driver control code), and as a result, the impedance value is changed and set from an initial value Z0 to a first value Z1. Hereinafter, it is assumed that the first value Z1 is larger than the initial value Z0.

Thereafter, at a time t12, the data may be output to the DQ node DQ according to a data read command READ of the command/address signal CA.

At a time of t13, according to a ZQ latch command ZQ CAL Latch of the command/address signal CA, the code generating unit 12 may generate the pull-up code P1[N-1:0] and the pull-down code P2[N-1:0] again by using the external ZQ resistor and the control unit 14 may generate the first pull-up ZQ code M1[I-1:0], the first pull-down ZQ code M2[I-1:0], the second pull-up ZQ code E1[J-1:0], and the second pull-down ZQ code E2[J-1:0] again by using the generated pull-up code P1[N-1:0] and pull-down code P2[N-1:0]. As a result, the impedance value is changed and set from the first value Z1 to a second value Z2, and thus the driver control code (e.g., a main driver control code and/or the fine-tuned driver control code) may be changed during a time period when neither a read operation nor a write operation for the memory cell array is being performed. As a result, a current strength of the output driver is changed. Hereinafter, it is assumed that the second value Z2 is larger than the first value Z1.

Further, at the time of t13, even when the ZQ latch command ZQ CAL Latch of the command/address signal CA is not input, the code generating unit 12 may generate the pull-up code P1[N-1:0] and the pull-down code P2[N-1:0] again by using the external ZQ resistor and the control unit 14 may generate the first pull-up ZQ code M1[I-1:0], the first pull-down ZQ code M2[I-1:0], the second pull-up ZQ code E1[J-1:0], and the second pull-down ZQ code E2[J-1:0] again by using the generated pull-up code P1[N-1:0] and pull-down code P2[N-1:0]. As a result, the impedance value is changed and set from the first value Z1 to the second value Z2.

Therefore, in some embodiments, even when the ZQ latch command ZQ CAL Latch is not input, the semiconductor memory device 1000 according to an exemplary embodiment updates the first pull-up ZQ code M1[I-1:0], the first pull-down ZQ code M2[I-1:0], the second pull-up ZQ code E1[J-1:0], and the second pull-down ZQ code E2[J-1:0] to change the impedance value provided to the transmission line TL. For example, the update may be based on periodic internal commands to update the impedance value, and thus change the current strength of the data output driver (wherein, for example, a current strength increases with lower impedance and decreases with higher impedance).

Next, the operation of changing the impedance value of the output driver 18 will be described with reference to a timing diagram of FIG. 9.

Figure 9:
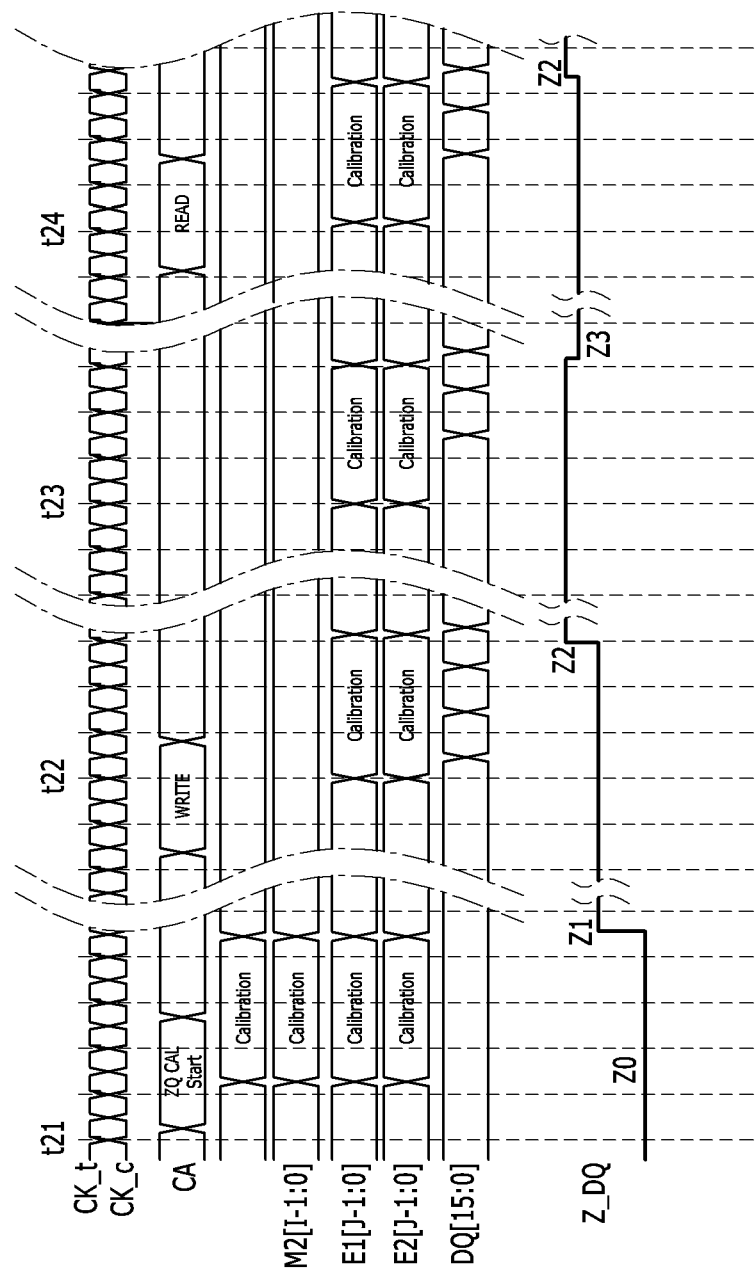

FIG. 9 is a timing diagram illustrating the operation of the semiconductor memory device 1000 according to an exemplary embodiment. As illustrated in FIG. 9, the code generating unit 12 performs the ZQ calibration operation when the ZQ calibration start command ZQ CAL Start is first input at a time of t21 after the power-up.

For example, the code generating unit 12 may generate a primary calibration code including an initial pull-up code P1[N-1:0] and an initial pull-down code P2[N-1:0] by using the external ZQ resistor according to the ZQ calibration start command ZQ CAL Start which is the command/address signal CA at the time of t21.

In addition, the control unit 14 may generate a refined calibration code including the first pull-up ZQ code M1[I-1:0], the first pull-down ZQ code M2[I-1:0] (together the M1 and M2 codes comprising a main calibration code), the second pull-up ZQ code E1[J-1:0], and the second pull-down ZQ code E2[J-1:0] (together the E1 and E2 codes comprising a fine tuning calibration code) by using the initial pull-up code P1[N-1:0] and the initial pull-down code P2[N-1:0].

Then, the first pull-up driver 180U and the first pull-down driver 180D operate by the first pull-up ZQ code M1[I-1:0] and the first pull-down ZQ code M2[I-1:0], and as a result, the impedance value is changed and set from the initial value Z0 to the first value Z1.

Thereafter, at a time t22, external data may be input in the DQ node DQ according to a data write command WRITE of the command/address signal CA.

In this case, the code generating unit 12 updates the pull-up code P1[N-1:0] and the pull-down code P2[N-1:0]. For example, the code generating unit 12 may update the pull-up code P1[N-1:0] and the pull-down code P2[N-1:0] even when a separate ZQ command is not input.

When the pull-up code P1[N-1:0] and pull-down code P2[N-1:0] values are updated, the control unit 14 may update the second pull-up ZQ code E1 [J-1:0] and second pull-down ZQ code E2[J-1:0] values. In this case, the second pull-up ZQ code E1[J-1:0] and the second pull-down ZQ code E2[J-1:0] may be changed. These updated values may specifically change the fine tuned calibration code without changing the main calibration code. In many situations, only small changes to impedance would need to be changed, so these changes can be made using a linear code that only affects a smaller number of smaller sub-transistors (e.g., those which receive the linear calibration code), rather than changing the states of a larger number of main transistors (e.g., those which receive the binary calibration codes). As a result, according to certain embodiments, because only the fine tuned calibration code is changed to recalibrate the impedance matching, fewer transistors of the data output driver would need to change state.

For example, the impedance values of the second pull-up driver 182U and the second pull-down driver 182D of the output driver 18, which correspond to the changed second pull-up ZQ code E1[J-1:0] and second pull-down ZQ code E2[J-1:0] may be changed from the first value Z1 to the second value Z2.

In this case, even though a separate ZQ latch command is not input, the second pull-up ZQ code E1[J-1:0] and the second pull-down ZQ code E2[J-1:0] are updated, and as a result, the impedance values may be changed even while outputting the data to the DQ node DQ (e.g., during a write operation).

At a time of t23 when a predetermined time elapsed from the time of t22, the second pull-up ZQ code E1[J-1:0] and the second pull-down ZQ code E2[J-1:0] may be updated and the impedance values of the second pull-up driver 182U and the second pull-down driver 182D of the output driver 18 may be changed from the second value Z2 to a third value Z3. It is assumed that the third value Z3 is smaller than the second value Z2 and the third value Z3 is larger than the first value Z1. For example, this change may be controlled by a periodic internal command or cycle internal to the memory device.

Again, at a time t24, the data may be output to the DQ node DQ according to the data read command READ of the command/address signal CA. Even in this case, the second pull-up ZQ code E1[J-1:0] and the second pull-down ZQ code E2[J-1:0] may be updated and the impedance values of the second pull-up driver 182U and the second pull-down driver 182D of the output driver 18 may be changed from the third value Z3 to the second value Z2.

A period between the time of t22 and the time of t23 may be the same as a period between the time of t23 and a time of t24. For example, the output driver 18 may periodically change the impedance value. In this case, the control unit 14 may periodically update only the second pull-up ZQ code E1[J-1:0] and the second pull-down ZQ code E2[J-1:0] (e.g., only the fine tuning calibration code).

Since the size of the sub pull-up transistor UT2[J-1:0] included in the second pull-up driver 182U is small, the distortion of the data output by the output driver 18 is small in spite of changing the impedance value of the second pull-up driver 182U while the output driver 18 outputs the data. Similarly, since the size of the sub pull-down transistor DT2[J-1:0] included in the second pull-down driver 182D is small, the distortion of the data output by the output driver 18 is small in spite of changing the impedance value of the second pull-down driver 182D while the output driver 18 outputs the data.

Therefore, since the changed second pull-up ZQ code E1[J-1:0] and second pull-down ZQ code E2[J-1:0] are not latched, a time of receiving the latch command ZQ CAL Latch is not required. Therefore, the data output of the output driver 18 need not stop. Since the impedance value of the output driver 18 may be updated without stopping the data output, a data output period may be secured.

Hereinafter, the control unit 14 that generates the pull-up ZQ codes M1[I-1:0] and E1[J-1:0] and the pull-down ZQ codes M2[I-1:0] and E2[J-1:0] will be described with reference to FIGS. 10 to 13.

Figure 10:
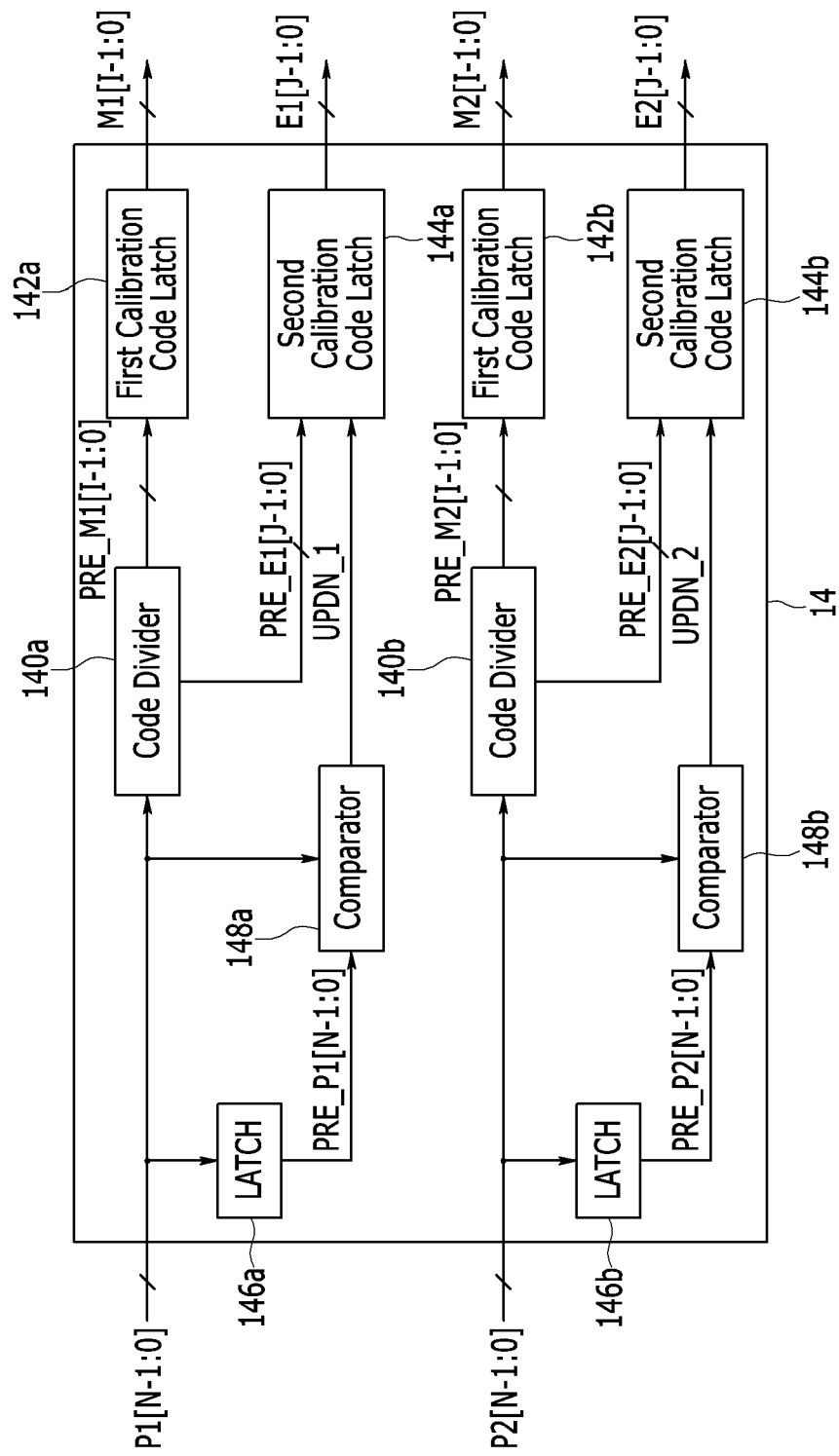
FIG. 10 is a block diagram schematically illustrating a control unit illustrated in FIG. 4, according to some example embodiments.

FIG. 10 is a block diagram illustrating the control unit according to an exemplary embodiment. As illustrated in FIG. 10, the control unit 14 may include code dividers 140a and 140b, first calibration code latches 142a and 142b, second calibration code latches 144a and 144b, latches 146a and 146b, and comparators 148a and 148b.

First, the code division unit 140a may divide an input pull-up code P1[N-1:0] into a first pull-up ZQ code PRE_M1[I-1:0] and a second pull-up ZQ code PRE_E1[J-1:0]. The divided first pull-up ZQ code PRE_M1[I-1:0] and second pull-up ZQ code PRE_E1[J-1:0] may be transferred to the first calibration code latch 142a and the second calibration code latch 144a to be output to the pre-driver 16.

The latch 146a may latch the input pull-up code PRE_P1 [N-1:0] to the comparator 148a. The comparator 148a compares the pull-up code P1[N-1:0] and the pull-up code PRE_P1[N-1:0] which is transferred from the latch 146a to generate a control signal UPDN_1. For example, the comparator 148a may output a first-level control signal UPDN_1 when the pull-up code P1[N-1:0] is larger than the pull-up code PRE_P1[N-1:0], output a second-level control signal UPDN_1 smaller than the first level when the pull-up code P1[N-1:0] is equal to the pull-up code PRE_P1[N-1:0], and output a third-level control signal UPDN_1 smaller than the second level when the pull-up code P1[N-1:0] is smaller than the pull-up code PRE_P1[N-1:0].

The second calibration code latch 144a changes a value of the second pull-up ZQ code PRE_E1[J-1:0] according to the level of the control signal UPDN_1 to be output as the second pull-up ZQ code E1[J-1:0]. For example, the second calibration code latch 144a increases a value of the second pull-up ZQ code PRE_E1[J-1:0] when the control signal UPDN_1 is at the first level to be output as the second pull-up ZQ code E1[J-1:0]. The second calibration code latch 144a may output the second pull-up ZQ code PRE_E1[J-1:0] as the second pull-up ZQ code E1[J-1:0] when the control signal UPDN_1 is at the second level. The second calibration code latch 144a decreases a value of the second pull-up ZQ code PRE_E1[J-1:0] to output the decreased second pull-up ZQ code PRE_E1[J-1:0] as the second pull-up ZQ code E1[J-1:0] when the control signal UPDN_1 is at the third level.

Hereinabove, the code division unit 140a, the first calibration code latch 142a, the second calibration code latch 144a, the latch 146a, and the comparator 148a for outputting the pull-up ZQ codes M1[I-1:0] and E1[J-1:0] are described. This is equal or similar to the code division unit 140b, the first calibration code latch 142b, the second calibration code latch 144b, the latch 146b, and the comparator 148b for outputting the pull-down ZQ codes M2[I-1:0] and E2[J-1:0]. Thus, the description for the code division unit 140b, the first calibration code latch 142b, the second calibration code latch 144b, the latch 146b, and the comparator 148b will be omitted.

Next, a method for generating the pull-up ZQ codes M1[I-1:0] and E1[J-1:0] and the pull-up ZQ codes M2[I-1:0] and E2[J-1:0] will be described in detail with reference to FIGS. 11 to 13.

Figure 11:
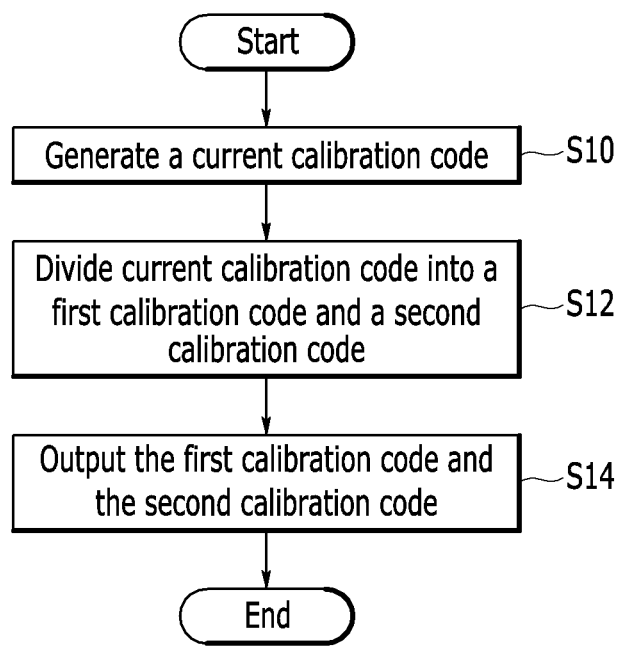
FIGS. 11 and 12 are flowcharts illustrating an impedance calibration method according to an exemplary embodiment.
Figure 12:
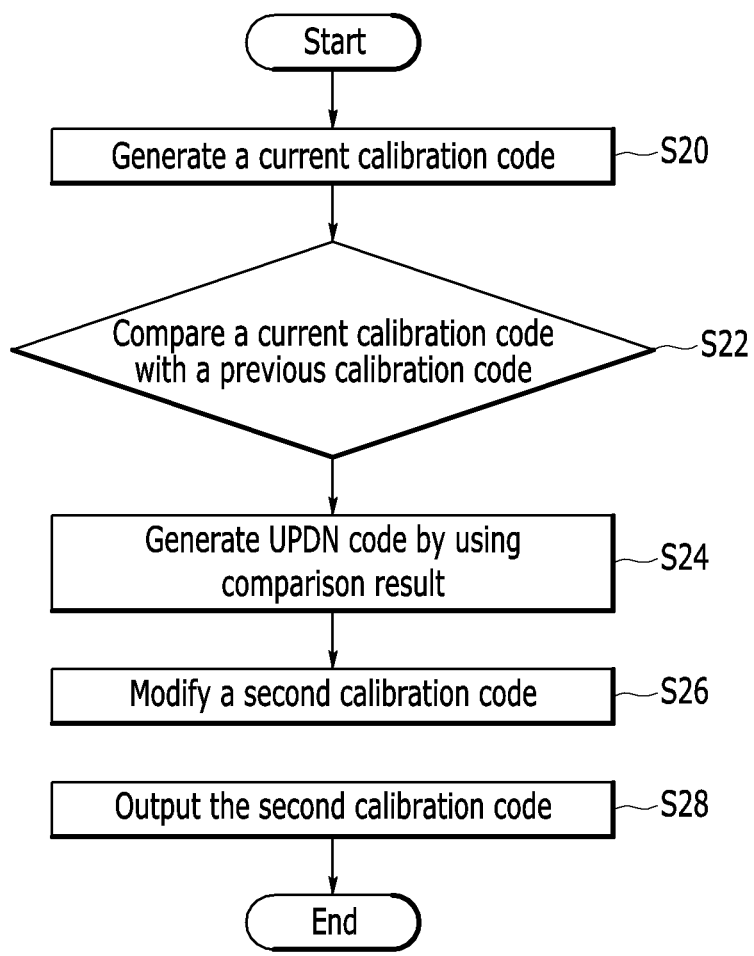

FIGS. 11 and 12 are flowcharts illustrating an impedance calibration method according to an exemplary embodiment and FIG. 13 is a table for describing an example of the impedance calibration method according to the exemplary embodiment.

First, referring to FIGS. 11 and 13, the code generation unit 12 generates a pull-up code P1[N-1:0] and a pull-down code P2[N-1:0] by using an external resistance RZQ (S10). The code generation unit 12 may generate the pull-up code P1[N-1:0] and the pull-down code P2[N-1:0] when the semiconductor memory device starts the operation after power-up. Alternatively, the code generation unit 12 may generate the pull-up code P1[N-1:0] and the pull-down code P2[N-1:0] when a ZQ calibration start command ZQ CAL Start is input, and/or at periodic intervals. The generated pull-up code P1[N-1:0] and pull-down code P2[N-1:0] may be output to the control unit 14. In this case, the latch 146a of the control unit 14 stores the input pull-up code P1[N-1:0] and the latch 146b may store the input pull-down code P2[N-1:0].

The code division unit 140a of the control unit 14 divides the pull-up code P1[N-1:0] into the first pull-up ZQ code PRE_M1[I-1:0] and the second pull-up ZQ code PRE_E1[J-1:0] and the code division unit 140b divides the pull-down code P2[N-1:0] into a first pull-down ZQ code PRE_M2[I-1:0] and a second pull-down ZQ code PRE_E2[J-1:0] (S12) to be output to the first calibration code latch 142a and the second calibration code latch 144a.

In detail, the value of the second pull-up ZQ code E1[J-1:0] may be set so that substantially the same numbers of '0' and '1' are included in the second pull-up ZQ code E1[J-1:0], and the value of the second pull-down ZQ code E2[J-1:0] may be set so that substantially the same numbers of '0' and '1' are included in the second pull-down ZQ code E2[J-1:0].

For example, when the bit number configuring the second pull-up ZQ code E1[J-1:0] is an even number, the value of the second pull-up ZQ code E1[J-1:0] (or second pull-down ZQ code E2[J-1:0]) is set so that the same numbers of '0' and '1' are included (e.g., 000111). Alternatively, when the bit number configuring the second pull-up ZQ code E1[J-1:0] (or second pull-down ZQ code E2[J-1:0]) is an odd number, the value of the second pull-up ZQ code E1[J-1:0] is set so that the numbers of '0' and '1' are included with one difference (e.g., 00111). These settings may be default initial settings when either even or odd numbers of bits are included in the ZQ code, and these settings may allow for later adjustments in both directions, so as to slightly increase or decrease the impedance of the data output driver by only changing the sub-transistors that receive a linear driver control code. Further, in some embodiments, the value of the second pull-up ZQ code E1[J-1:0] and the value of the second pull-down ZQ code E2[J-1:0] may be set so that the second pull-up ZQ code E1[J-1:0] and the second pull-down ZQ code E2[J-1:0] initially include only '0'. In addition, the values of the second pull-up ZQ code E1[J-1:0] and the second pull-down ZQ code E2[J-1:0] may be set to have various values.

Then, the first calibration code latch 142a and the second calibration code latch 144a output the first pull-down ZQ code PRE_M2[I-1:0] and the second pull-down ZQ code PRE_E2[J-1:0] to the pre-driver 16 (S14).

The operations of the code generation unit 12 and the control unit 14 will be described with reference to the first step of FIG. 13 together. The pull-up code P1[N-1:0] generated in the code generation unit 12 is assumed as '101000' as a binary code.

The code diver 140a divides the pull-up code P1[N-1:0] into the first pull-up ZQ code PRE_M1[I-1:0] and the second pull-up ZQ code PRE_E1[J-1:0]. It is assumed that the first pull-up ZQ code PRE_M1[I-1:0] is a binary code of 6 bits and the second pull-up ZQ code PRE_E1[J-1:0] is a linear code of 6 bits including 6 bits having the same size as the least significant bit of the first pull-up ZQ code PRE_M1[I-1:0].

The code divider 140a divides '101000' (40 in a decimal number) as the pull-up code P1[N-1:0] into '100101' (37 in a decimal number) as the first pull-up ZQ code PRE_M1[I-1:0] and '000111' (3 in a decimal number) as the second pull-up ZQ code PRE_E1[J-1:0]. In this case, the numbers of '0' and '1' are determined so that the second pull-up ZQ code PRE_E1[J-1:0] satisfies 3 as the decimal number and may have the value of '111000' and '101010' even in addition to '000111'. In this manner, the combined value of the first and second calibration codes (e.g., the main and fine tuning calibration codes) is the same as the value of the original, primary calibration code.

In addition, the control unit 14 may output the generated first pull-up ZQ code PRE_M1[I-1:0] and the second pull-up ZQ code PRE_E1[J-1:0] to the pre-driver 16.

Hereinabove, the method for generating the first pull-up ZQ code PRE_M1[I-1:0] and the second pull-up ZQ code PRE_E1[J-1:0] by using the pull-up code P1[N-1:0] is described, but this can be equally applied even to the method for generating the first pull-down ZQ code PRE_M2[I-1:0] and the second pull-down ZQ code PRE_E2[J-1:0] by using the pull-down code P2[N-1:0].

Next, referring to FIGS. 12 and 13, the code generation unit 12 generates a pull-up code P1[N-1:0] and a pull-down code P2[N-1:0] by using an external resistance RZQ (S20).

The code generation unit 12 may periodically generate the pull-up code P1[N-1:0] and the pull-down code P2[N-1:0] while the semiconductor memory device 1000 operates. Alternatively, or additionally, the code generation unit 12 may generate the pull-up code P1[N-1:0] and the pull-down code P2[N-1:0] when a ZQ latch command ZQ CAL Latch is input.

When the generated pull-up code P1[N-1:0] and the pull-down code P2[N-1:0] are input, the comparators 148a and 148b of the control unit 14 compare the generated pull-up code P1[N-1:0] and pull-down code P2[N-1:0] with the pull-up code PRE_P1[N-1:0] and the pull-down code PRE_P2[N-1:0] latched in the latches 146a and 146b, respectively (S22).

The comparators 148a and 148b of the control unit 14 may generate control signals UPDN_1 and UPDN_2 according to the compared result to be output to the second calibration code latches 144a and 144b.

The second calibration code latches 144a and 144b change values of the second pull-up ZQ code PRE_E1[J-1:0] and the second pull-down ZQ code PRE_E2[J-1:0] by using the input control signals UPDN_1 and UPDN_2 (S26).

In addition, the second calibration code latches 144a and 144b outputs the changed second pull-up ZQ code PRE_E1[J-1:0] and second pull-down ZQ code PRE_E2[J-1:0] as the second pull-up ZQ code E1[J-1:0] and the second pull-down ZQ code E2[J-1:0].

The operations of the code generation unit 12 and the control unit 14 will be described with reference to the second step and the third step of FIG. 13 together.

In the second step, the pull-up code P1[N-1:0] generated in the code generation unit 12 is assumed as '101001,' increased by '000001' compared with the first step, as a binary code. When the pull-up code P1[N-1:0] is transferred to the control unit 14, the pull-up code PRE_P1[N-1:0] having a value of '101000' is stored in the latch 146a.

Since the pull-up code P1[N-1:0] has a value which is larger than the pull-up code PRE_P1[N-1:0] having the value of '101000' transferred from the latch 146a as '101001', the comparator 148a may generate the control signal UPDN_1 having the first level.

The second calibration code latch 144a receives the control signal UPDN_1 having the first level and increases the value of the second pull-up ZQ code PRE_E1[J-1:0] having a value of '000111' to be changed to '001111'.

The value of the second pull-up ZQ code PRE_E1[J-1:0] may be set as '111100', '101011', or the like even in addition to '001111' so that the value satisfies 4 as the decimal number by increasing '000001'.

The second calibration code latch 144a updates '000111' of the second pull-up ZQ code PRE_E1[J-1:0] to '001111' to be output to the pre-driver 16 as the second pull-up ZQ code E1[J-1:0]. In this manner, the fine tuning calibration code changes while the main calibration code remains the same.

In the third step, the pull-up code P1[N-1:0] generated in the code generation unit 12 is assumed as '101010' increased by '000001' compared with the second step, as a binary code. When the pull-up code P1[N-1:0] is transferred to the control unit 14, the pull-up code PRE_P1[N-1:0] having a value of '101001' is stored in the latch 146a.

Since the pull-up code P1[N-1:0] has a value which is larger than the pull-up code PRE_P1[N-1:0] having the value of '101001' transferred from the latch 146a as '101010', the comparator 148a may generate the control signal UPDN_1 having the third level.

The second calibration code latch 144a receives the control signal UPDN_1 having the third level and increases the value of the second pull-up ZQ code PRE_E1[J-1:0] having a value of '001111' to be changed to '011111'.

The value of the second pull-up ZQ code PRE_E1[J-1:0] may be set as '111110', '101111', or the like even in addition to '011111' so that the value satisfies 5 as the decimal number by increasing '000001'.

The second calibration code latch 144a updates '001111' of the second pull-up ZQ code PRE_E1[J-1:0] to '011111' to be output to the pre-driver 16 as the second pull-up ZQ code E1[J-1:0]. In this manner, the overall calibration code and impedance value (and current strength) of the data output driver may be changed, but by only changing a state of one small sub-transistors, rather than by changing the states of two main transistors, one of which is larger than the sub-transistors. In this manner, based on the discussion above, in certain embodiments, only one reference transistor in this example would need to change state rather than three reference transistors.

Hereinabove, the method for dividing the pull-up code P1[N-1:0] into the first pull-up ZQ code M1[I-1:0] and the second pull-up ZQ code E1[J-1:0] is described, but this can be equally applied even to the method for dividing the pull-down code P2[N-1:0] into the first pull-down ZQ code M2[I-1:0] and the second pull-down ZQ code E2[J-1:0].

According to the exemplary embodiment, the data output circuit 10 may change only the value of the second pull-up ZQ code E1[J-1:0] when the lower bit value of the pull-up code P1[N-1:0] is changed according to a PVT change. Then, an impedance value of the second pull-up driver 182U of the output driver 18 corresponding to the second pull-up ZQ code E1[J-1:0] may be changed. Since a sub pull-up transistor UT2[J-1:0] included in the second pull-up driver 182U has a small size, while the data is output in the output driver 18, even though the impedance value of the second pull-up driver 182U is changed, the distortion is small in the data output from the output driver 18. For example, since the impedance value of the second driver 18 is updated without stopping the data output of the output driver 18, the data output period may be better ensured.

Next, a semiconductor memory device and a semiconductor device according to another exemplary embodiment will be described with reference to FIGS. 14 to 19.

Figure 14:
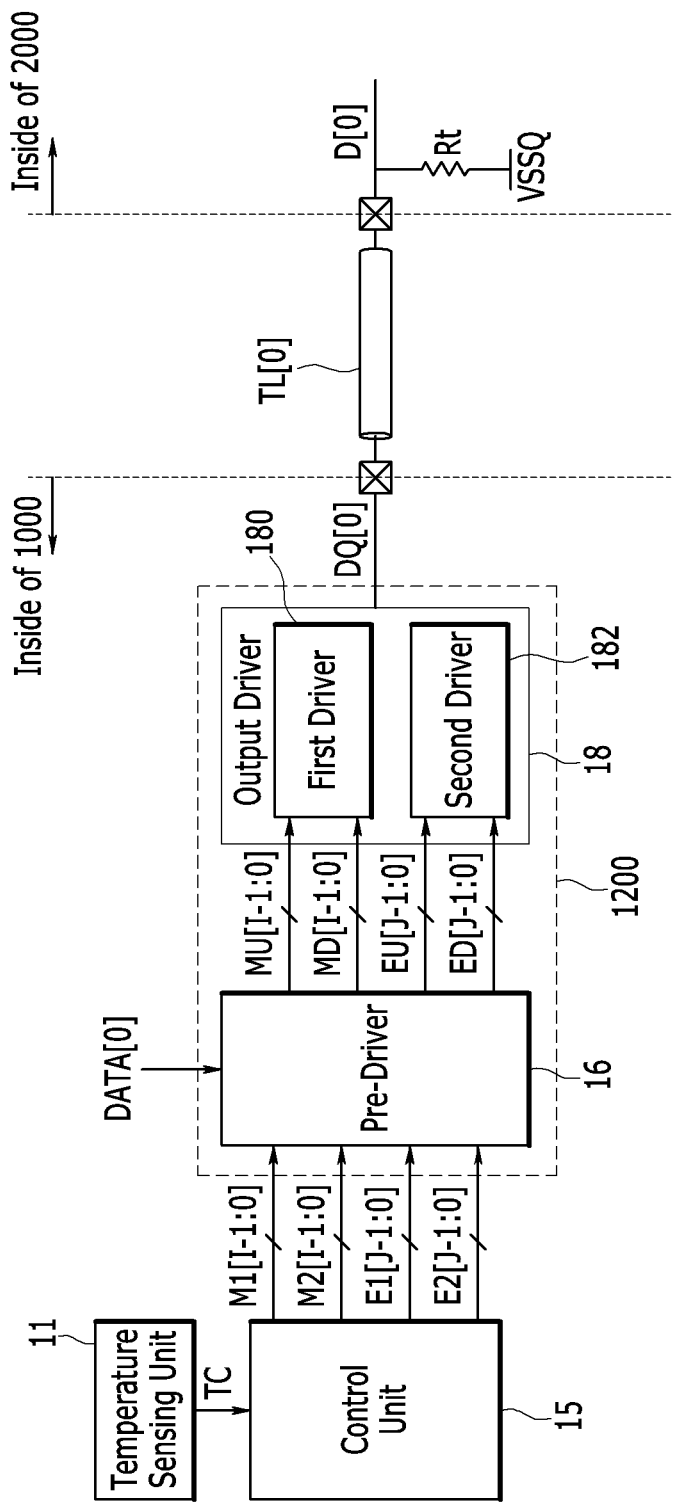
FIG. 14 is a block diagram illustrating a part of a data output circuit according to another exemplary embodiment.

FIG. 14 is a block diagram illustrating a part of a data output circuit according to another exemplary embodiment. The data output circuit illustrated in FIG. 14 further includes a temperature sensing unit 11 (e.g., temperature detection unit) compared with the data output circuit illustrated in FIG. 4. The temperature detection unit 11 detects a temperature of the semiconductor memory device 1000 to generate a temperature code TC including information on the detected temperature.

The control unit 15 may generate and output a first pull-up ZQ code P11[N-1:0], a first pull-down ZQ code P21[N-1:0], a second pull-up ZQ code P12[M-1:0], and a second pull-down ZQ code P22[M-1:0] by using the temperature code TC. The control unit 15 will be described with reference to FIGS. 15 and 16 together.

Figure 15:
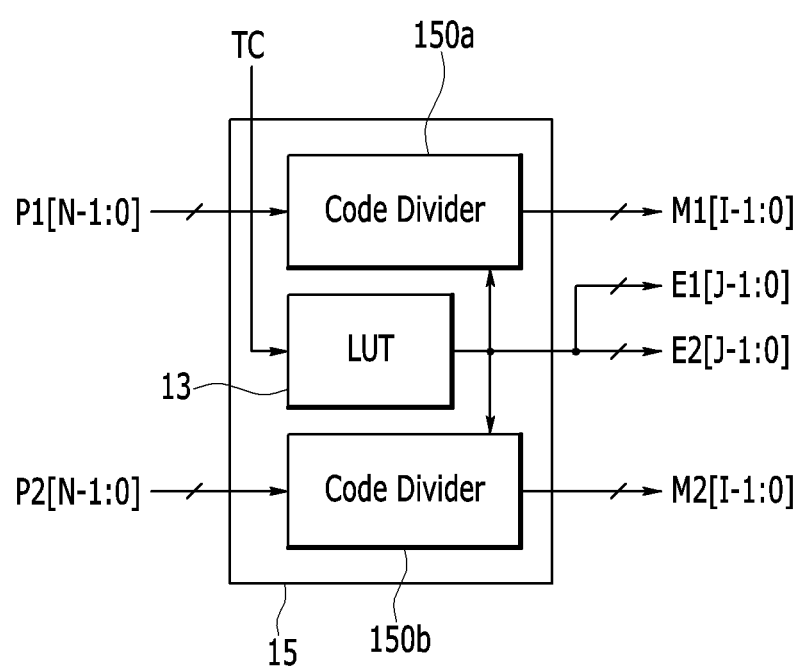
FIG. 15 is a block diagram schematically illustrating a control unit illustrated in FIG. 14, according to some example embodiments.

FIG. 15 is a block diagram schematically illustrating the control unit 15 illustrated in FIG. 14 and FIG. 16 is a diagram illustrating a look-up table of FIG. 15.

As illustrated in FIG. 15, the control unit 15 may include code dividers 150a and 150b and a look-up table 13. In the drawing, a case where the look-up table 13 is included in the control unit 15 is illustrated, but the present invention is not limited thereto.

In the look-up table 13, values of a second pull-up ZQ code E1[J-1:0] and a second pull-down ZQ code E2[J-1:0] corresponding to temperature ranges divided in plural, respectively, are stored. The look-up table 13 may output the second pull-up ZQ code E1[J-1:0] and the second pull-down ZQ code E2[J-1:0] corresponding to the temperature ranges in which the temperatures are included according to the input temperature code TC. The second pull-up ZQ code E1[J-1:0] and the second pull-down ZQ code E2[J-1:0] are output to the pre-driver 16 and the code dividers 150a and 150b.

As illustrated in FIG. 16, when the temperature range according to the input temperature code TC is equal to or smaller than a first reference value (0), the look-up table 13 may output the second pull-up ZQ code E1[J-1:0] and the second pull-down ZQ code E2[J-1:0] having '000000' as the value. When the temperature range according to the input temperature code TC is greater than the first reference value and equal to or smaller than a second reference value (1), the look-up table 13 may output the second pull-up ZQ code E1[J-1:0] and the second pull-down ZQ code E2[J-1:0] having '000001' as the value.

The code divider 150a may generate and output a first pull-up ZQ code M1[I-1:0] by using the input pull-up code P1[N-1:0] and second pull-up ZQ code E1[J-1:0]. Similarly, the code divider 150b may generate and output a first pull-down ZQ code M2[I-1:0] by using the input pull-down code P2[N-1:0] and second pull-down ZQ code E2[J-1:0].

Next, a method for generating the pull-up ZQ codes M1[I-1:0] and E1[J-1:0] and the pull-down ZQ codes M2[I-1:0] and E2[J-1:0] will be described in detail with reference to FIGS. 17 to 19.

Figure 17:
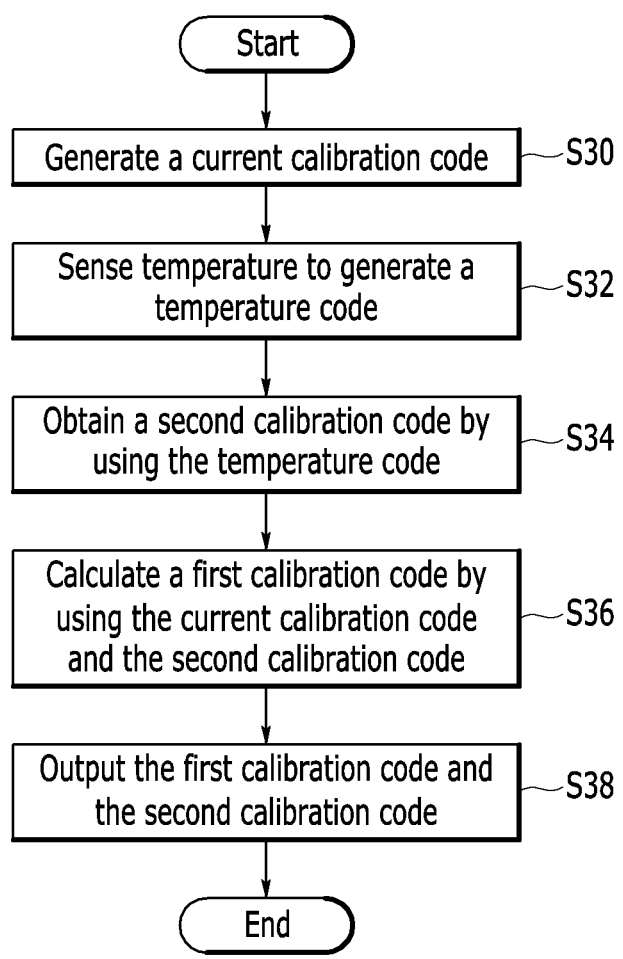
FIGS. 17 and 18 are flowcharts illustrating an impedance calibration method according to another exemplary embodiment.
Figure 18:
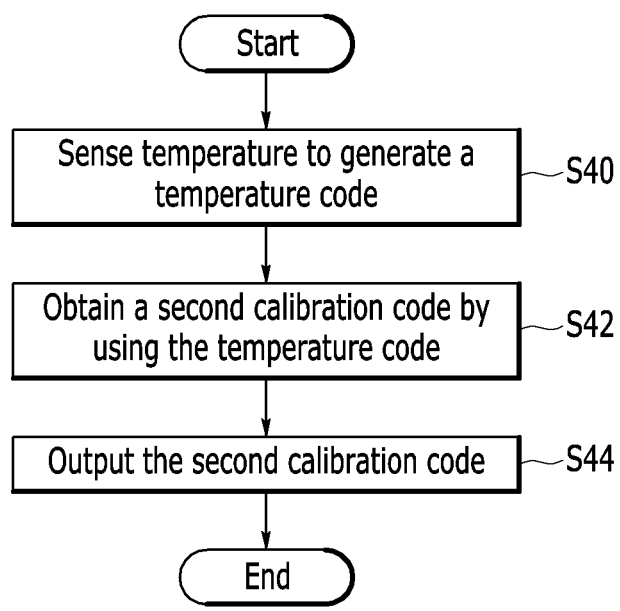

FIGS. 17 and 18 are flowcharts illustrating an impedance calibration method according to another exemplary embodiment and FIG. 19 is a table for describing an example of the impedance calibration method according to another exemplary embodiment.

First, referring to FIGS. 17 and 19, the code generation unit 12 generates a pull-up code P1[N-1:0] and a pull-down code P2[N-1:0] by using an external resistance RZQ (S30). The code generation unit 12 may generate the pull-up code P1[N-1:0] and the pull-down code P2[N-1:0] (e.g., an initial calibration code) when the semiconductor memory device starts the operation after power-up. Alternatively, the code generation unit 12 may generate the pull-up code P1[N-1:0] and the pull-down code P2[N-1:0] (e.g., a calibration code) when a ZQ calibration start command ZQ CAL Start is input. The generated pull-up code P1[N-1:0] and pull-down code P2[N-1:0] may be output to the control unit 15.

The temperature detection unit 11 detects an operation temperature to generate a temperature code TC (S32).

Next, the control unit 15 acquires a second pull-up ZQ code E1[J-1:0] and a second pull-down ZQ code E2[J-1:0] (e.g., a fine tuning calibration code) by using the temperature code TC (S34). The control unit 15 may acquire the second pull-up ZQ code E1[J-1:0] and the second pull-down ZQ code E2[J-1:0] corresponding to the temperature ranges in which the temperatures are included according to the input temperature code TC, by using the look-up table 13.

The code dividers 150a and 150b calculate the first pull-up ZQ code M1[I-1:0] and the first pull-down ZQ code M2[I-1:0] by using the input pull-up code P1[N-1:0], pull-down code P2[N-1:0], second pull-up ZQ code E1[J-1:0], and second pull-down ZQ code E2[J-1:0] (S36).

In addition, the control unit 15 outputs the pull-up ZQ code M1[I-1:0], the first pull-down ZQ code M2[I-1:0], the second pull-up ZQ code E1[J-1:0], and the second pull-down ZQ code E2[J-1:0] to the pre-driver 16 (S38).

The operations of the code generation unit 12, the temperature detection unit 13, and the control unit 15 will be described with reference to the first step of FIG. 19 together. The pull-up code P1[N-1:0] generated in the code generation unit 12 is assumed as '101000' as a binary code.

When the temperature range according to the temperature code TC generated in the temperature detection unit 13 is equal to or smaller than the first reference value (0), the second pull-up ZQ code E1[J-1:0] and the second pull-down ZQ code E2[J-1:0] having the values of '000000' may be output in the look-up table 13.

The code divider 150a subtracts '000000' (0 in a decimal number) as the second pull-up ZQ code E1[J-1:0] (0 in a decimal number) from '101000' (40 in a decimal number) as the pull-up code P1[N-1:0] to calculate the first pull-up ZQ code PRE_M1[I-1:0] as '101000' (40 in a decimal number).

In addition, the control unit 15 may output the generated first pull-up ZQ code M1[I-1:0] and the second pull-up ZQ code E1[J-1:0] to the pre-driver 16.

Hereinabove, the method for generating the first pull-up ZQ code M1[I-1:0] by using the pull-up code P1[N-1:0] and the second pull-up ZQ code E1[J-1:0] is described, but this can be equally applied to the method for generating the first pull-down ZQ code M2[I-1:0] by using the pull-down code P2[N-1:0] and the second pull-down ZQ code E2[J-1:0].

Next, referring to FIGS. 18 and 19, the temperature detection unit 11 generates a temperature code TC by detecting the operation temperature (S40). The temperature detection unit 11 periodically or aperiodically detects an operation temperature while the semiconductor memory device 1000 operates to generate the temperature code TC.

Next, the control unit 15 acquires a second pull-up ZQ code E1[J-1:0] and a second pull-down ZQ code E2[J-1:0] by using the temperature code TC (S42). The control unit 15 may acquire a second pull-up ZQ code E1[J-1:0] and a second pull-down ZQ code E2[J-1:0] corresponding to the temperature ranges in which the temperatures are included according to the input temperature code TC, by using the look-up table 13.

In addition, the control unit 15 outputs the second pull-up ZQ code E1[J-1:0] and the second pull-down ZQ code E2[J-1:0] to the pre-driver 16 (S44).

The operations of the temperature detection unit 13 and the control unit 15 will be described with reference to the second step of FIG. 19 together.

When the temperature range according to the temperature code TC generated in the temperature detection unit 13 is greater than the first reference value and equal to or smaller than a second reference value (1), the second pull-up ZQ code E1[J-1:0] and the second pull-down ZQ code E2[J-1:0] having '000001' as the value may be output from the look-up table 13.

In addition, the control unit 15 may output the generated second pull-up ZQ code E1[J-1:0] and second pull-down ZQ code E2[J-1:0] to the pre-driver 16.

According to the exemplary embodiment, the data output circuit 10 may generate the second pull-up ZQ code E1[J-1:0] and the second pull-down ZQ code E2[J-1:0] according to the operation temperature of the semiconductor memory device 1000. Further, the data output circuit 10 may update the second pull-up ZQ code E1[J-1:0] and the second pull-down ZQ code E2[J-1:0] according to a change in operation temperature of the semiconductor memory device 1000.

While various aspects of this invention have been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

We claim:

1. A method of controlling a semiconductor device, the semiconductor device comprising:
a memory cell array including a plurality of memory cells connected between a plurality of word lines and a plurality of bit lines;
a row decoder for receiving a row address and selecting a word line corresponding to the row address;
a column decoder for receiving a column address and selecting a bit line corresponding to the column address;
a sense amplifier for reading data stored in a memory cell connected to the selected word line and the selected bit line; and
a data output driver including a first driver including a plurality of first pull-up transistors having different sizes from each other and a plurality of first pull-down transistors having different sizes from each other, and a second driver including a plurality of second pull-up transistors having the same size as each other and a plurality of second pull-down transistors having different sizes from each other, the first driver and the second driver outputting the data to an output pad and driven to provide impedance to the output pad, the method comprising:
at a first time, outputting a first calibration code for the first driver and a second calibration code for the second driver to control the impedance provided to the output pad; and
at a second time, changing the second calibration code for the second driver, without changing the first calibration code for the first driver, in order to change the impedance provided to the output pad.

2. The method of claim 1, wherein:
the first calibration code includes a plurality of bits, each bit corresponding to a respective transistor of the first driver; and
the second calibration code includes a plurality of bits, each bit corresponding to a respective transistor of the second driver.

3. The method of claim 2, wherein:
the first driver includes n transistors, each transistor receiving a bit based on one of the bits of the first calibration code, and each transistor having a different size ranging from a smallest relative size of 1 to a largest relative size of $1 \times 2^{n-1}$, wherein n is greater than 2; and
the second driver includes m transistors, each transistor receiving a bit based on one of the bits of the second calibration code, and each transistor having a size that is the same as the relative size of 1, wherein m is the same as or different from n and is at least 2.

4. The method of claim 3, wherein:
the sizes of the n transistors depend on a number of sub-transistors that make up each transistor; and
the sizes of the m transistors depend on a number of sub-transistors that make up each transistor.

5. The method of claim 1, wherein the first time is an initialization period for the semiconductor device, and the second time is during a read or write operation of the semiconductor device.

6. A semiconductor memory device comprising:
a memory cell array including a plurality of memory cells connected between a plurality of word lines and a plurality of bit lines;
a row decoder for receiving a row address and selecting a word line corresponding to the row address;
a column decoder for receiving a column address and selecting a bit line corresponding to the column address;
a sense amplifier for reading data stored in a memory cell connected to the selected word line and the selected bit line; and
a data output driver including:
a first driver including a plurality of first pull-up transistors having different sizes from each other and a plurality of first pull-down transistors having different sizes from each other, and configured to receive a main driver control code, and
a second driver including a plurality of second pull-up transistors having the same size as each other and a plurality of second pull-down transistors having the same size as each other, and configured to receive a fine tuned driver control code.

7. The semiconductor memory device of claim 6, wherein:
the first driver is configured to receive the main driver control code as a binary code; and
the second driver is configured to receive the fine tuned driver control code as a linear code.

8. The semiconductor memory device of claim 7, wherein the semiconductor memory device is configured to adjust the fine tuned driver control code without adjusting the main driver control code in order to change a current strength of the data output driver.

9. The semiconductor memory device of claim 8, wherein the semiconductor memory device is configured to adjust the fine tuned driver control code without adjusting the main driver control code during a read and/or write operation of the semiconductor memory device.

10. The semiconductor memory device of claim 6, further comprising a pre-driver configured to:
receive data and receive a calibration code including a main calibration code and a fine tuning calibration code;
output the main driver control code based on the data and the main calibration code; and
output the fine tuned driver control code based on the data and the fine tuning calibration code.

11. The semiconductor memory device of claim 6, wherein the first driver and the second driver output data to an output pad, and provide impedance matching for the semiconductor memory device.

* * * * *